US012588325B2

(12) United States Patent
Lee et al.

(10) Patent No.: US 12,588,325 B2
(45) Date of Patent: Mar. 24, 2026

(54) DISPLAY DEVICE

(71) Applicant: Samsung Display Co., LTD., Yongin-si (KR)

(72) Inventors: Jong Won Lee, Hwaseong-si (KR); Je Won Yoo, Bucheon-si (KR); Hyun Min Cho, Seoul (KR); Basrur Veidhes, Yongin-si (KR); Myeong Hee Kim, Yongin-si (KR); Yong Sub Shim, Gwangmyeong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 1168 days.

(21) Appl. No.: 17/501,466

(22) Filed: Oct. 14, 2021

(65) Prior Publication Data

US 2022/0173274 A1 Jun. 2, 2022

(30) Foreign Application Priority Data

Nov. 30, 2020 (KR) ......................... 10-2020-0163839

(51) Int. Cl.
| | |
|---|---|
| *H10H 20/831* | (2025.01) |
| *H01L 25/075* | (2006.01) |
| *H01L 25/16* | (2023.01) |
| *H10D 86/40* | (2025.01) |
| *H10H 20/832* | (2025.01) |
| *H10H 20/852* | (2025.01) |
| *H10H 20/856* | (2025.01) |
| *H10H 20/857* | (2025.01) |
| *H10H 29/14* | (2025.01) |

(52) U.S. Cl.
CPC ...... *H10H 20/8312* (2025.01); *H10H 20/835* (2025.01); *H10H 29/142* (2025.01)

(58) Field of Classification Search
CPC .. H10H 20/852; H10H 20/835; H10H 20/856; H10D 86/40; H01L 25/167
See application file for complete search history.

(56) References Cited

U.S. PATENT DOCUMENTS

| | | | |
|---|---|---|---|
| 11,276,807 | B2 | 3/2022 | Maeda et al. |
| 11,652,198 | B2 | 5/2023 | Maeda et al. |
| 12,074,264 | B2 | 8/2024 | Kim et al. |
| 2015/0200207 | A1* | 7/2015 | Nozu ................ G02F 1/136227 |
| | | | 438/585 |

(Continued)

FOREIGN PATENT DOCUMENTS

| | | |
|---|---|---|
| JP | 2013-4834 | 1/2013 |
| JP | 2020-053480 A | 4/2020 |

(Continued)

*Primary Examiner* — Antonio B Crite

(74) *Attorney, Agent, or Firm* — Womble Bond Dickinson (US) LLP

(57) ABSTRACT

A display device includes a first reflective electrode disposed on a surface of a substrate, a second reflective electrode spaced apart from the first reflective electrode and disposed on the surface of the substrate, and a light emitting element disposed between the first reflective electrode and the second reflective electrode. The first reflective electrode includes first surface irregularities disposed on a top surface of the first reflective electrode. The second reflective electrode includes second surface irregularities disposed on a top surface of the second reflective electrode.

16 Claims, 15 Drawing Sheets

(56)         References Cited

U.S. PATENT DOCUMENTS

| 2019/0198735 A1 * | 6/2019 | Tsai ................... H01L 25/0753 |
| 2021/0066564 A1 * | 3/2021 | Kanaya ............... H10H 20/856 |
| 2024/0379917 A1 | 11/2024 | Kim et al. |

FOREIGN PATENT DOCUMENTS

| KR | 20110138756 A | * | 12/2011 | ............. H01L 33/60 |
| KR | 20110138757 A | * | 12/2011 | ............. H01L 33/60 |
| KR | 10-2014-0118484 | | 10/2014 | |
| KR | 2020-0005711 A | | 1/2020 | |
| KR | 10-2020-0022061 | | 3/2020 | |
| KR | 10-2022-0023922 | | 3/2022 | |
| WO | WO-2020149475 A1 | * | 7/2020 | ......... H01L 25/0753 |

* cited by examiner

DISPLAY DEVICE

CROSS REFERENCE TO RELATED APPLICATION(S)

This application claims priority to and benefits of Korean Patent Application No. 10-2020-0163839 under 35 U.S.C. § 119, filed on Nov. 30, 2020 in the Korean Intellectual Property Office, the entire contents of which are incorporated herein by reference.

BACKGROUND

1. Technical Field

The disclosure relates to a display device.

2. Description of the Related Art

The importance of display devices has steadily increased with the development of multimedia technology. Various types of display devices such as an organic light emitting display (OLED), a liquid crystal display (LCD) and the like have been developed in response to such developments.

A display device is a device for displaying an image, and includes a display panel, such as an organic light emitting display panel or a liquid crystal display panel. The light emitting display panel may include light emitting elements, e.g., light emitting diodes (LED), and examples of the light emitting diode include an organic light emitting diode (OLED) using an organic material as a fluorescent material and an inorganic light emitting diode using an inorganic material as a fluorescent material.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Aspects of the disclosure provide a display device having improved light emission efficiency.

However, aspects of the disclosure are not restricted to the one set forth herein. The above and other aspects of the disclosure will become more apparent to one of ordinary skill in the art to which the disclosure pertains by referencing the detailed description of the disclosure given below.

According to an aspect of the embodiments, a display device may include, a first reflective electrode disposed on a surface of a substrate, a second reflective electrode spaced apart from the first reflective electrode, disposed on the surface of the substrate, and a light emitting element disposed between the first reflective electrode and the second reflective electrode. The first reflective electrode may include first surface irregularities disposed on a top surface of the first reflective electrode. The second reflective electrode may include second surface irregularities disposed on a top surface of the second reflective electrode.

In an embodiment, each of the first reflective electrode and the second reflective electrodes may comprise silver (Ag), aluminum (Al), gold (Au), platinum (Pt), palladium (Pd), indium (In), nickel (Ni), chrome (Cr), or an alloy thereof.

In an embodiment, the display device may include a first insulating layer disposed on the first reflective electrode and the second reflective electrode. The first insulating layer may expose at least a part of the first reflective electrode and at least a part of the second reflective electrode. The light emitting element may be disposed on the first insulating layer.

In an embodiment, the display device may include a first contact electrode disposed on the first reflective electrode, the first contact electrode electrically contacting the first reflective electrode exposed by the first insulating layer and electrically contacting a first end of the light emitting element. The display device may also include a second contact electrode disposed on the second reflective electrode, the second contact electrode electrically contacting the second reflective electrode exposed by the first insulating layer and electrically contacting a second end of the light emitting element.

In an embodiment, the display device may include a second insulating layer disposed on the first contact electrode and the second contact electrode, and covering the first contact electrode and the second contact electrode. A refractive index of the second insulating layer may be different from a refractive index of the first contact electrode and different from a refractive index of the second contact electrode.

In an embodiment, the refractive index of the second insulating layer may be smaller than the refractive index of the first contact electrode and smaller than the refractive index of the second contact electrode.

In an embodiment, the display device may include a filler disposed on the first and second contact electrodes. A refractive index of the filler may be smaller than the refractive index of the first contact electrode and smaller than the refractive index of the second contact electrode.

In an embodiment, the first contact electrode may electrically connect the light emitting element and the first reflective electrode that are spaced apart from each other. The second contact electrode may electrically connect the light emitting element and the second reflective electrode that are spaced apart from each other.

In an embodiment, the first contact electrode may include third surface irregularities that correspond to the first surface irregularities of the first reflective electrode and are disposed in a region where the first contact electrode contacts the first reflective electrode.

In an embodiment, the first surface irregularities and the second surface irregularities may have a same surface roughness.

In an embodiment, the first surface irregularities and the second surface irregularities each may have a random shape.

In an embodiment, the first surface irregularities and the second surface irregularities may be patterned to have a constant size.

In an embodiment, a size of each of the first surface irregularities and the second surface irregularities may be within a range of a wavelength band of light emitted from the light emitting element.

In an embodiment, the display device may include a first sub-bank disposed on the surface of the substrate and including a side surface facing a first end of the light emitting element. The first reflective electrode may be disposed on the first sub-bank. The first surface irregularities may be disposed in a region overlapping at least the side surface of the first sub-bank.

In an embodiment, the display device may include a second sub-bank spaced apart from the first sub-bank, disposed on the surface of the substrate, and including a side surface facing a second end of the light emitting element. The second reflective electrode may be disposed on the second sub-bank, and including the second surface irregularities in a region overlapping at least the side surface of the second sub-bank.

According to an embodiment, a display device may include a first electrode disposed on a substrate, and including surface irregularities disposed on a top surface of the first electrode, a second electrode spaced apart from the first electrode, disposed on the substrate, and including surface irregularities disposed on a top surface of the second electrode, a light emitting element disposed between the first electrode and the second electrode, a first contact electrode disposed on the first electrode, the first contact electrode electrically connecting the first electrode to a first end of the light emitting element, a second contact electrode disposed on the second electrode, the second contact electrode electrically connecting the second electrode to a second end of the light emitting element, and an insulating layer disposed on the first contact electrode and the second contact electrode, and covering the first contact electrode and the second contact electrode. A refractive index of the insulating layer is different from a refractive index of the first contact electrode and different from a refractive index of the second contact electrode.

In an embodiment, the refractive index of the insulating layer may be smaller than the refractive index of the first contact electrode and smaller than the refractive index of the second contact electrode.

In an embodiment, each of the first and second electrodes may comprise silver, aluminum, gold, platinum, palladium, indium, nickel, chrome, or an alloy thereof.

In an embodiment, the surface irregularities of the first electrode and the surface irregularities of the second electrode may be patterned to have a constant size.

In an embodiment, a size of each of the surface irregularities of the first electrode and a size of the surface irregularities of the second electrode is within a range of a wavelength band of light emitted from the light emitting element.

In the display device according to an embodiment, the light emitted from the light emitting element and incident on the surfaces of the first and second electrodes may be diffusely reflected to randomly change the light traveling direction by including a textured surface on the surfaces of the first and second electrodes. By randomly changing the light traveling direction, the formation rate of an optical waveguide that may be formed by layers arranged in the area adjacent to the light emitting element may be reduced, and the amount of light emitted from the light emitting element to the outside of the layers may be increased, thereby improving the light emission efficiency of the display device.

It should be noted that the effects of the disclosure are not limited to those described above, and other effects of the disclosure will be apparent from the following description.

BRIEF DESCRIPTION OF THE DRAWINGS

The above and other aspects and features of the disclosure will become more apparent by describing in detail embodiments thereof with reference to the attached drawings, in which:

FIG. 6B is an enlarged schematic cross-sectional view of area Q of FIG. 6A;

DETAILED DESCRIPTION OF THE EMBODIMENTS

Figure 1:
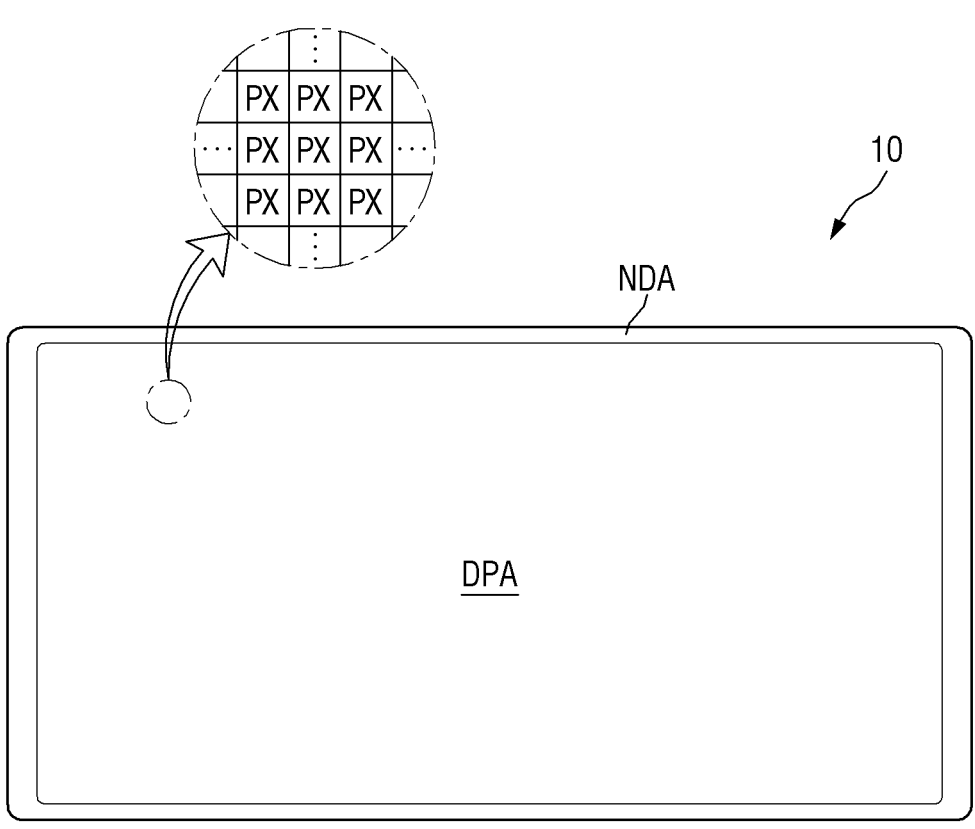
FIG. 1 is a schematic plan view of a display device according to an embodiment.
Figure 1:
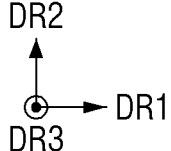

The embodiments will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

In the drawings, sizes, thicknesses, ratios, and dimensions of the elements may be exaggerated for ease of description and for clarity. Like numbers refer to like elements throughout.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

When an element is described as 'not overlapping' or 'to not overlap' another element, this may include that the elements are spaced apart from each other, offset from each other, or set aside from each other or any other suitable term as would be appreciated and understood by those of ordinary skill in the art.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

It will be understood that when an element (or a region, a layer, a portion, or the like) is referred to as "being on", "connected to" or "coupled to" another element in the specification, it can be directly disposed on, connected, or coupled to another element mentioned above, or intervening elements may be disposed therebetween.

It will be understood that the terms "connected to" or "coupled to" may include a physical or electrical connection or coupling.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments will be described with reference to the accompanying drawings.

FIG. 1 is a schematic plan view of a display device according to an embodiment.

Referring to FIG. 1, a display device 10 displays a moving image or a still image. The display device 10 may refer to any electronic device providing a display screen. Examples of the display device 10 may include a television, a laptop computer, a monitor, a billboard, an Internet-of-Things device, a mobile phone, a smartphone, a tablet personal computer (PC), an electronic watch, a smart watch, a watch phone, a head-mounted display, a mobile communication terminal, an electronic notebook, an electronic book, a portable multimedia player (PMP), a navigation device, a game machine, a digital camera, a camcorder and the like, which may provide a display screen.

The display device 10 may include a display panel which provides a display screen. Examples of the display panel may include inorganic light emitting diode display panels, organic light emitting display panels, quantum dot light emitting display panels, plasma display panels and field emission display panels. In the following description, the embodiments include an inorganic light emitting diode display panel, but the disclosure is not limited thereto, and other display panels may be applied within the same scope of the technical spirit.

Hereinafter, a first direction DR1, a second direction DR2, and a third direction DR3 may be defined in drawings of an embodiment describing the display device 10. The first direction DR1 and the second direction DR2 may be directions perpendicular to each other in a plane. The third direction DR3 may be a direction perpendicular to a plane defined by first direction DR1 and the second direction DR2. The third direction DR3 may be perpendicular to each of the first direction DR1 and the second direction DR2. In an embodiment describing the display device 10, the third direction DR3 indicates a thickness direction (or display direction) of the display device 10.

The display device 10 may have a rectangular shape including long and short sides such that the side in the first direction DR1 is longer than the side in the second direction DR2 in plan view. A corner portion where the long side and the short side of the display device 10 meet may be right-angled in plan view. However, the disclosure is not limited thereto, and it may be rounded to have a curved shape. The shape of the display device 10 is not limited to the shape illustrated and may be variously modified. For example, the display device 10 may have other shapes such as a square shape, a quadrilateral shape with rounded corners (vertices), other polygonal shapes and a circular shape in plan view.

A display surface of the display device 10 may be disposed on a side of the third direction DR3 which is the thickness direction. In embodiments describing the display device 10, unless otherwise noted, the term "upward" refers to a side of the third direction DR3, which is the display direction, and the term "top surface" refers to a surface toward the side of the third direction DR3. Further, the term "downward" refers to the other side in the third direction DR3, which is an opposite direction to the display direction, and the term "bottom surface" refers to a surface toward the other side of the third direction DR3. Furthermore, "left", "right", "upper" and "lower" indicate directions when the display device 10 is viewed from above. For example, "right side" indicates a side of the first direction DR1, "left side" indicates the other side of the first direction DR1, "upper side" indicates a side of the second direction DR2, and "lower side" indicates the other side of the second direction DR2.

The display device 10 may include the display area DPA and a non-display area NDA. The display area DPA is an area where a screen can be displayed, and the non-display area NDA is an area where a screen is not displayed.

The shape of the display area DPA may follow the shape of the display device 10. For example, the shape of the display area DPA may have a rectangular shape similar to the overall shape of the display device 10 in plan view. The display area DPA may substantially occupy the center of the display device 10.

The display area DPA may include pixels PX. The pixels PX may be arranged in a matrix. The shape of each pixel PX may be a rectangular or square shape in plan view. Each pixel PX may include a light emitting elements made of inorganic particles.

The non-display area NDA may be disposed around the display area DPA. The non-display area NDA may completely or partially surround the display area DPA. The non-display area NDA may form a bezel of the display device 10.

Figure 2:
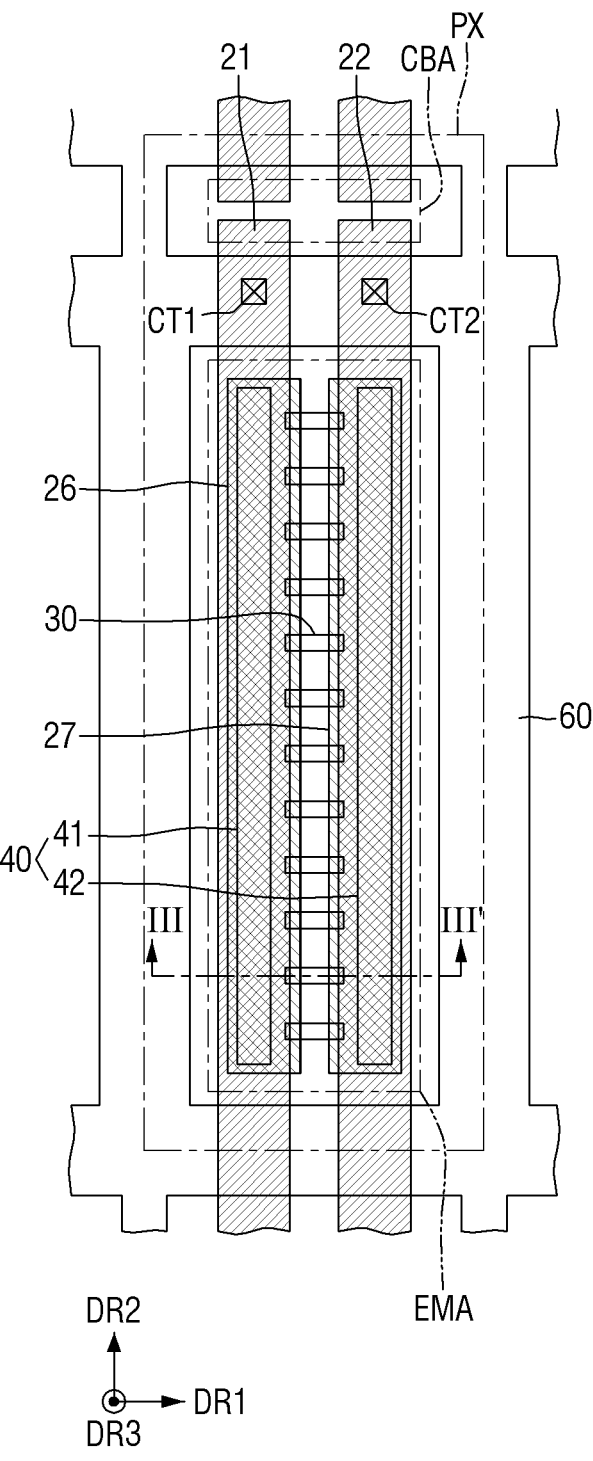
FIG. 2 is a schematic plan view illustrating a pixel of a display device according to an embodiment.
Figure 3:
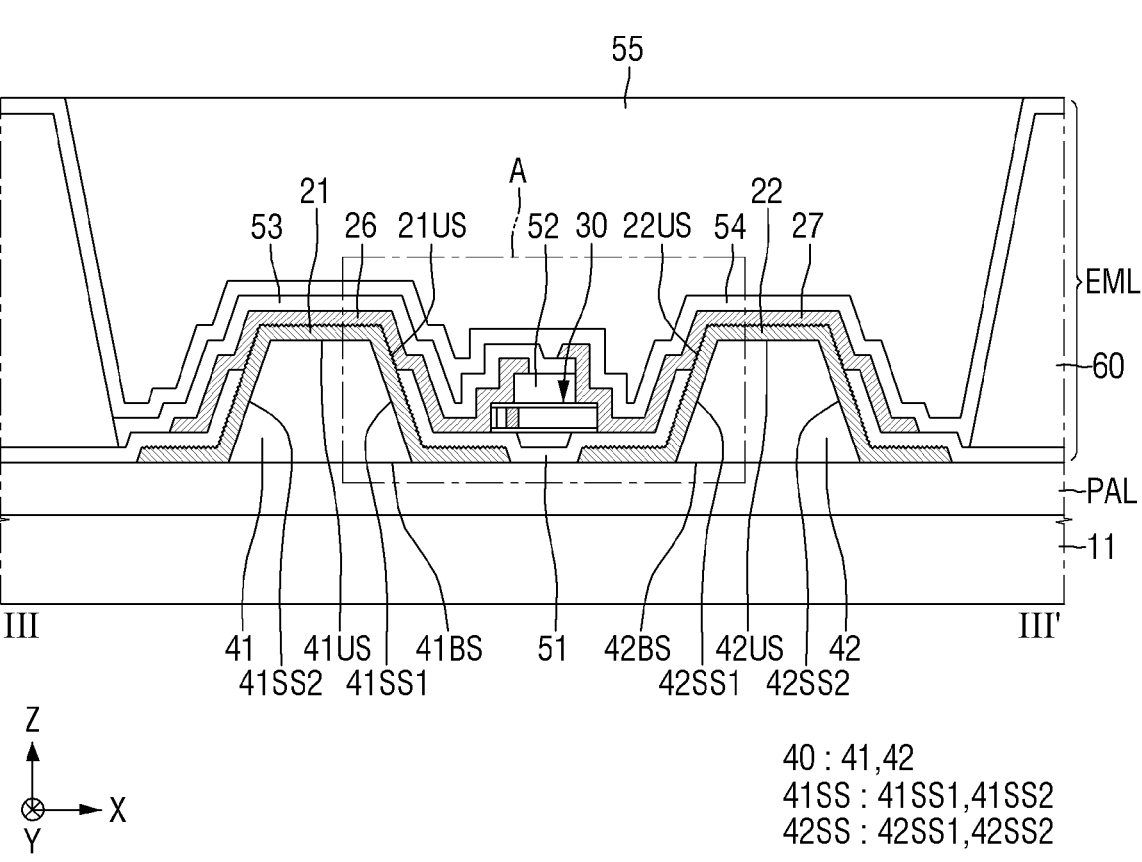
FIG. 3 is a schematic cross-sectional view illustrating an example taken along line III-III' of FIG. 2.

FIG. 2 is a schematic plan view illustrating a pixel of a display device according to an embodiment. FIG. 3 is a schematic cross-sectional view illustrating an example taken along line III-III' of FIG. 2.

Referring to FIG. 2, each pixel PX of the display device 10 may include an emission area EMA and a non-emission area. The emission area EMA may be defined as an area in which light emitted from a light emitting element 30 is emitted, and the non-emission area may be defined as an area in which light is not emitted because the light emitted from the light emitting element 30 does not reach.

The emission area EMA may include an area in which the light emitting element 30 is disposed and an area adjacent thereto. The emission area may also include a region in which the light emitted from the light emitting element 30 is reflected or refracted by another member and emitted.

Each pixel PX may further include a cutout area CBA disposed in the non-emission area. The cutout area CBA may be disposed at the upper side (or a side in the second direction DR2) from the emission area EMA within a pixel PX. The cutout area CBA may be disposed between the emission areas EMA of the pixels PX disposed adjacent to each other in the second direction DR2.

The cutout area CBA may be a region in which electrodes 21 and 22 included in each of the pixels PX adjacent to each other along the second direction DR2 are separated. The electrodes 21 and 22 provided in each pixel PX are separated in the cutout area CBA, and a part of the electrodes 21 and 22 provided in each pixel PX may be disposed in the cutout area CBA. The light emitting element 30 may not be disposed in the cutout area CBA.

Referring to FIGS. 2 and 3, the display device 10 may include a substrate SUB, a circuit element layer PAL disposed on the substrate SUB, and a light emitting element layer EML disposed on the circuit element layer PAL. The light emitting element layer EML may include a first bank 40, first and second electrodes 21 and 22, a second bank 60, a light emitting element 30, first and second contact electrodes 26 and 27, insulating layers 51, 52, 53, and 54, and a filler 55.

The substrate SUB may be an insulating substrate. The substrate SUB may be made of an insulating material such as glass, quartz, or polymer resin. The substrate SUB may be a rigid substrate, but may also be a flexible substrate which can be bent, folded, or rolled.

The circuit element layer PAL may be disposed on the substrate SUB. The circuit element layer PAL may include at least one transistor and the like to drive the light emitting element layer EML.

The first bank 40 may be disposed on the circuit element layer PAL. Although not shown in the drawings, the circuit element layer PAL may include a via layer, and the first bank 40 may be disposed on the via layer of the circuit element layer PAL.

The first bank 40 may have a shape extending in the second direction DR2 within each pixel PX in plan view. The first bank 40 may end while being separated within the emission area EMA partitioned by the second bank 60 so that the first bank 40 does not extend to the adjacent pixel PX in the second direction DR2.

The first bank 40 may include a first sub-bank 41 and a second sub-bank 42. The first sub-bank 41 and the second sub-bank 42 may be spaced apart from each other and disposed to face each other in the first direction DR1. For example, the first sub-bank 41 may be disposed on the left side of the emission area EMA in plan view, and the second sub-bank 42 may be disposed on the right side of the emission area EMA in plan view. The space between the first and second sub-banks 41 and 42 spaced apart from each other may provide an area where light emitting elements 30 are disposed.

The first and second sub-banks 41 and 42 may each have a structure in which at least a part protrudes from the top surface of the substrate SUB. The protruding parts of the first and second sub-banks 41 and 42 may have inclined side surfaces.

The first sub-bank 41 may include a top surface 41US, a bottom surface 41BS and a side surface 41SS. The bottom surface 41BS of the first sub-bank 41 may be placed on a surface of the circuit element layer PAL. The top surface 41US of the first sub-bank 41 may face the bottom surface 41BS of the first sub-bank 41.

The side surface 41SS of the first sub-bank 41 may include a first side surface 41SS1 and a second side surface 41SS2. The first side surface 41SS1 of the first sub-bank 41 may be a side surface located on a side facing the second sub-bank 42 in a pixel PX, and the second side surface 41SS2 of the first sub-bank 41 may be a side surface located on the other side opposite to a side facing the second sub-bank 42. The first side surface 41SS1 of the first sub-bank 41 may face the second sub-bank 42 and/or the light emitting element 30, and the second side surface 41SS2 of the first sub-bank 41 may face the second bank 60.

The side surface 41SS of the first sub-bank 41 may be inclined at an angle with respect to the bottom surface 41BS of the first sub-bank 41. As the first sub-bank 41 includes the inclined side surface 41SS, the first sub-bank 41 may change the traveling direction of light emitted from the light emitting element 30 and proceeding to the side surface 41SS of the first sub-bank 41, for example, the first side surface 41SS1 of the first sub-bank 41, to the third direction DR3 (for example, the upward direction or the display direction).

Similarly, the second sub-bank 42 may include a top surface 42US, a bottom surface 42BS and a side surface 42SS. The bottom surface 42BS of the second sub-bank 42 may be placed on a surface of the circuit element layer PAL. The top surface 42US of the second sub-bank 42 may face the bottom surface 42BS of the second sub-bank 42.

The side surface 42SS of the second sub-bank 42 may include a first side surface 42SS1 and a second side surface 42SS2. The first side surface 42SS1 of the second sub-bank 42 may be a side surface located on a side facing the first sub-bank 41 in a pixel PX, and the second side surface 42SS2 of the second sub-bank 42 may be a side surface located on the other side opposite to the side facing the first sub-bank 41. The first side surface 42SS1 of the second sub-bank 42 may face the first sub-bank 41 and/or the light emitting element 30, and the second side surface 42SS2 of the second sub-bank 42 may face the second bank 60.

The side surface 42SS of the second sub-bank 42 may be inclined at an angle with respect to the bottom surface 42BS of the second sub-bank 42. As the second sub-bank 42 includes the inclined side surface 42SS, the second sub-bank 42 may change the traveling direction of light emitted from the light emitting element 30 and proceeding to the side surface 42SS of the second sub-bank 42, for example, the first side surface 42SS1 of the second sub-bank 42, to the third direction DR3 (for example, the upward direction or the display direction).

Although the side surface of the first bank 40 is inclined in a linear shape in the drawings, the shape of the side surface of the first bank 40 is not limited thereto. For example, the side surface or the outer surface of the first bank 40 may have a curved semicircle or a half ellipse shape. In an embodiment, the first bank 40 may include an organic insulating material such as polyimide (PI), but is not limited thereto.

The first and second electrodes 21 and 22 may be disposed on the first bank 40. The first electrode 21 may be disposed on the first sub-bank 41 and the second electrode 22 may be disposed on the second sub-bank 42.

A voltage from the circuit element layer PAL may be applied to the first and second electrodes 21 and 22 so that the light emitting element 30 may emit light. During the manufacturing process of the display device 10, an alignment signal may be applied to the first and second electrodes 21 and 22 to form an electric field for aligning the light emitting elements 30. The first and second electrodes 21 and 22 may change the traveling direction of the light proceeding in the lateral direction among the lights emitted from the light emitting element 30 to the third direction DR3 (the upward direction or the display direction). Hereinafter, in the specification, the first electrode 21 and the second electrode 22 may be referred to as a first reflective electrode 21 and a second reflective electrode 22, respectively.

In an embodiment, each of the first and second electrodes 21 and 22 may include a conductive material having high reflectivity. For example, each of the first and second electrodes 21 and 22 may include metals such as silver (Ag), copper (Cu), aluminum (Al), gold (Au), platinum (Pt), palladium (Pd), indium (In), nickel (Ni), or chrome (Cr), or alloys of such metals. The structure of the first and second electrodes 21 and 22 may include multiple layers of such materials formed into integral structures. However, the disclosure is not limited thereto, and the structure of each of the first and second electrodes 21 and 22 may include one or more layers of a transparent conductive material and a material having high reflectivity stacked with each other, or may be formed as a single layer including these materials. For example, each of the first and second electrodes 21 and 22 may have a stacked structure such as ITO/Ag/ITO, ITO/Ag/IZO, or ITO/Ag/ITZO/IZO.

Each of the first electrode 21 and the second electrode 22 may have a shape extending in the second direction DR2 in plan view. The first electrode 21 and the second electrode 22 may be spaced apart from each other and disposed to face each other in the first direction DR1. The first electrode 21 and the second electrode 22 may have a shape similar to the planar shape of the first sub-bank 41 and the second sub-bank 42 to fully cover the first sub-bank 41 and the second sub-bank 42 in plan view, but may have a larger area.

The first electrode 21 may extend in the second direction DR2 in plan view so as to overlap a part of the second bank 60 extending in the first direction DR1. The first electrode 21 may be electrically connected to the circuit element layer PAL through a first contact hole CT1.

The second electrode 22 may extend in the second direction DR2 in plan view so as to overlap a part of the second bank 60 extending in the first direction DR1. The second electrode 22 may be electrically connected to the circuit element layer PAL through a second contact hole CT2.

The first electrode 21 and the second electrode 22 may be separated from the first and the second electrodes 21 and 22 of the neighboring pixel PX in the second direction DR2 in the cutout area CBA in the pixel PX, respectively. The planar shape of the first electrode 21 and the second electrode 22 separated in the cutout area CBA may be formed by cutting the first and second electrodes 21 and 22 in the cutout area CBA after disposing the light emitting element 30 during the manufacturing process of the display device 10. However, the disclosure is not limited thereto, and a part of the first and second electrodes 21 and 22 may extend to a neighboring pixel in the second direction DR2 and be integrated with the electrode of the neighboring pixel and only one of the first electrode 21 or the second electrode 22 may be separated in the cutout area CBA.

The first electrode 21 may be placed on the outer surface of the first sub-bank 41. The first electrode 21 may fully cover the top surface 41US and the side surface 41SS of the first sub-bank 41. The first electrode 21 may extend to the outer side from the first and second side surfaces 41SS1 and 41SS2 of the first sub-bank 41 to also be partially disposed on a surface of the circuit element layer PAL exposed by the first and second sub-banks 41 and 42.

The second electrode 22 may be placed on the outer surface of the second sub-bank 42. The second electrode 22 may fully cover the top surface 42US and the side surface 42SS of the second sub-bank 42. The second electrode 22 may extend to the outer side from the first and second side surfaces 42SS1 and 42SS2 of the second sub-bank 42 to also be partially disposed on a surface of the circuit element layer PAL exposed by the first and second sub-banks 41 and 42.

The top surface 21US (or the surface) of the first electrode 21 may not be flat. The top surface 21US of the first electrode 21 may include a textured surface (or surface irregularities). The top surface 21US of the first electrode 21 may include an textured surface and the top surface 21US of the first electrode 21 may have a surface roughness. The textured surface of the top surface 21US may provide a surface roughness. In the specification, the surface roughness may be defined as the degree of fine irregularities (i.e., the degree of roughness) that occur on the surface. Although in the drawing, the entire top surface 21US of the first electrode 21 disposed on the first sub-bank 41 includes a textured surface, the disclosure is not limited thereto. For example, the textured surface may be formed on a partial region of the top surface 21US of the first electrode 21.

Similarly, a top surface 22US of the second electrode 22 may not be flat. The top surface 22US of the second electrode 22 may include a textured surface. As the top surface 22US of the second electrode 22 includes an textured surface, the top surface 22US of the second electrode 22 may have a surface roughness. The textures surface of the top surface 22US may provide a surface roughness.

Although it is illustrated in the drawing that the entire top surface 22US of the second electrode 22 disposed on the second sub-bank 42 includes an textured surface, the disclosure is not limited thereto. For example, the textured surface may be formed on a partial region of the top surface 22US of the second electrode 22.

The first and second electrodes 21 and 22 may be electrically connected to the light emitting elements 30 to apply a voltage to the light emitting elements 30 for light emission. For example, the electrodes 21 and 22 may be electrically connected to the light emitting element 30 disposed between the first electrode 21 and the second electrode 22 (and the light emitting element 30 and the first and second electrodes 21 and 22 may be spaced apart from each other) through first and second contact electrodes 26 and 27, and an electrical signal applied to the electrodes 21 and 22 may be transmitted to the light emitting element 30 through the contact electrodes 26 and 27.

The first insulating layer 51 may be disposed on the first and second electrodes 21 and 22. The first insulating layer 51 may be disposed on the first electrode 21 and the second electrode 22 and expose at least a part of the first electrode 21 and the second electrode 22. The first insulating layer 51 may be formed entirely on a surface of the substrate SUB including the region between the first electrode 21 and the second electrode 22, but a part of the first electrode 21 and the second electrode 22 may be exposed in the region overlapping the top surface 41US of the first sub-bank 41 and the top surface 42US of the second sub-bank 42 in the third direction DR3.

The first insulating layer 51 may be formed to have a step such that a part of the top surface is recessed between the first electrode 21 and the second electrode 22 (forming a recessed surface between the first electrode 21 and the second electrode 22). The first insulating layer 51 may be formed such that a part of its top surface is recessed due to a step formed by a member (for example, the first electrode 21 and/or the second electrode 22) disposed thereunder. In some embodiments, an empty space may be formed between the light emitting element 30 and the top surface of the first insulating layer 51, a part of which is recessed due to the step formed between the first electrode 21 and the second electrode 22. The recessed portion of the first insulating layer 51 may be the portion where the first electrode 21 and second electrode 22 are not disposed under the first insulating layer 51. A material forming a second insulating layer 52 which will be described later may fill the empty space between the first insulating layer 51 and the light emitting element 30. However, the disclosure is not limited thereto, and the first insulating layer 51 may not have a step between the first electrode 21 and the second electrode 22. For example, the first insulating layer 51 may include a flat top surface to dispose the light emitting element 30 between the first electrode 21 and the second electrode 22.

The first insulating layer 51 may protect the first electrode 21 and the second electrode 22 while insulating them from each other. It is possible to prevent the light emitting element 30 disposed on the first insulating layer 51 from being damaged by direct contact with other members.

The second bank 60 may be disposed on the first insulating layer 51. The second bank 60 may be disposed in the form of a grid pattern including portions extending in the first and second directions DR1 and DR2 in plan view. The second bank 60 may be disposed across the boundary of each of the pixels PX to delimit the neighboring pixels PX.

The second bank 60 may have a height greater than that of the first bank 40. The second bank 60 may prevent ink from overflowing to adjacent pixels PX during an inkjet printing process for aligning the light emitting elements 30 in the manufacturing process of the display device 10. Further, the second bank 60 may be disposed to surround the emission area EMA and the cutout area CBA disposed for each pixel PX to delimit them from each other. In an embodiment, the second bank 60 may include an organic insulating material such as polyimide (PI), but is not limited thereto.

The light emitting element 30 may be disposed on the first insulating layer 51 between the first electrode 21 and the second electrode 22. The light emitting element 30 may have a shape extending in a substantially perpendicular direction to the first and second electrodes 21 and 22. However, the disclosure is not limited thereto. Some of the light emitting elements 30 may be arranged in a substantially perpendicular direction to the first and second electrodes 21 and 22, and other light emitting elements 30 may be arranged in an oblique angle to the first and second electrodes 21 and 22.

The second insulating layer 52 may be partially disposed on the light emitting element 30 disposed between the first electrode 21 and the second electrode 22. The second insulating layer 52 may be disposed to partially surround the outer surface of the light emitting element 30. The second insulating layer 52 may be disposed on the light emitting element 30 to expose both ends of the light emitting element 30. The second insulating layer 52 may function to protect the light emitting element 30 and also fix the light emitting element 30 in a manufacturing process of the display device 10.

Although not shown in the drawings, the material constituting the second insulating layer 52 may be disposed between the first electrode 21 and the second electrode 22, and fill the empty space between the light emitting element 30 and the first insulating layer 51 formed by the depression (or recessed step portion) as described above.

The first and second contact electrodes 26 and 27 may be disposed on the second insulating layer 52. The first and second contact electrodes 26 and 27 may have a shape extending in the second direction DR2 in plan view, respectively. The first contact electrode 26 and the second contact electrode 27 may be spaced apart from each other and disposed to face each other in the first direction DR1.

The first and second contact electrodes 26 and 27 may contact the light emitting element 30 and the electrodes 21 and 22, respectively. The first contact electrode 26 may be disposed on the first electrode 21 and the second contact electrode 27 may be disposed on the second electrode 22. The first contact electrode 26 may contact an end of the light emitting element 30 while contacting the top surface 21US of the first electrode 21 exposed by the first insulating layer 51. The second contact electrode 27 may contact the other end of the light emitting element 30 while contacting the top surface 22US of the second electrode 22 exposed by the first insulating layer 51.

The first contact electrode 26 and the second contact electrode 27 may include a textured surface on a part of the bottom surface. The bottom surface of the first contact electrode 26 may include a textured surface in the region contacting the first electrode 21, and may be flat in the region not contacting the first electrode 21. Similarly, the bottom surface of the second contact electrode 27 may include a textured surface in the region contacting the second electrode 22, and may be flat in the region not contacting the second electrode 22. The first and second contact electrodes 26 and 27 may have flat top surfaces.

The end of the light emitting element 30 exposed by the second insulating layer 52 may be electrically connected to the first electrode 21 through the first contact electrode 26 and the other end may be electrically connected to the second electrode 22 through the second contact electrode 27.

A third insulating layer 53 may be disposed on the first contact electrode 26. The third insulating layer 53 may electrically insulate the first contact electrode 26 and the second contact electrode 27 from each other. The third insulating layer 53 may be disposed to completely cover the first contact electrode 26, but may not be disposed on the other end of the light emitting element 30 so that the light emitting element 30 can contact the second contact electrode 27.

The second contact electrode 27 may be disposed on the second electrode 22, the second insulating layer 52, and the third insulating layer 53. The second contact electrode 27 may extend to the side of the second insulating layer 52 and the third insulating layer 53 from the other end of the light emitting element 30 to also be partially disposed on the third insulating layer 53.

The first and second contact electrodes 26 and 27 may include a conductive material. For example, it may include ITO, IZO, ITZO, aluminum (Al), or the like. In an embodiment, the first and second contact electrodes 26 and 27 may include a transparent conductive material, but are not limited thereto.

A fourth insulating layer 54 may be entirely disposed on the substrate SUB. The fourth insulating layer 54 may function to protect the members disposed on the substrate SUB against the external environment.

The filler 55 may fill the region partitioned by the second bank 60. The filler 55 may protect members included in the light emitting element layer EML. The filler 55 is not particularly limited as long as the material thereof does not damage members disposed below while transmitting light. The filler 55 may be omitted.

Figure 4:
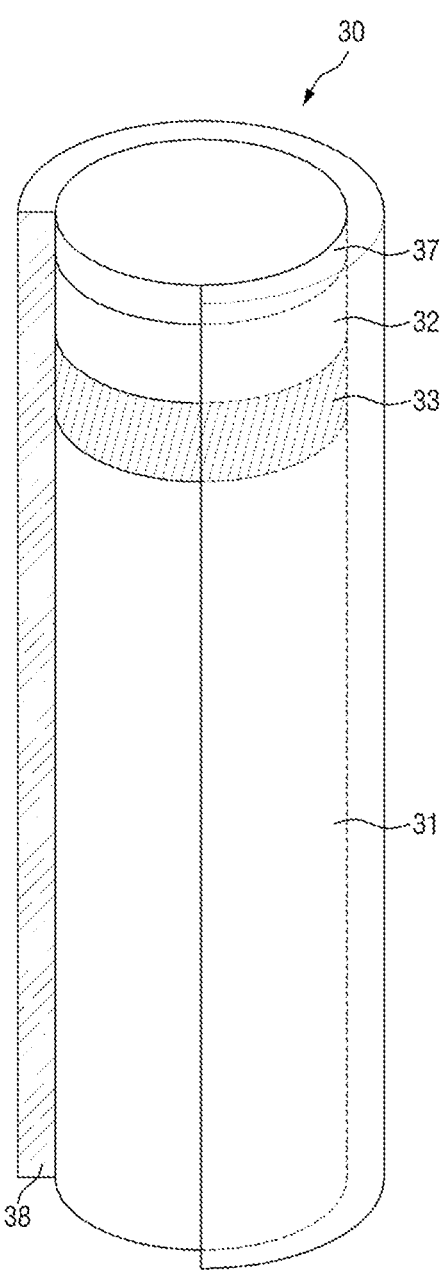
FIG. 4 is a schematic diagram of a light emitting element according to an embodiment.

FIG. 4 is a schematic diagram of a light emitting element according to an embodiment.

Referring to FIG. 4, the light emitting element 30 which is a particulate element may have a rod or cylindrical shape having an aspect ratio. The length of the light emitting element 30 may be larger than the diameter of the light emitting element 30, and the aspect ratio may be about 3:1 to about 10:1, but the disclosure is not limited thereto.

The light emitting element 30 may have a size of a nanometer scale (equal to or greater than about 1 nm and less than about 1 μm) to a micrometer scale (equal to or greater than about 1 μm and equal to or less than about 1 mm). In an embodiment, both the diameter and the length of the light emitting element 30 may be on a nanometer scale, or on a micrometer scale. In other embodiments, the diameter of the light emitting element 30 may be on a nanometer scale, while the length of the light emitting element 30 may be on a micrometer scale. In some embodiments, some of the light emitting elements 30 may have a diameter and/or length on a nanometer scale, while some others of the light emitting elements 30 may have a diameter and/or length on a micrometer scale.

In an embodiment, the light emitting element may be an inorganic light emitting diode. The light emitting element 30 may include a semiconductor layer doped with any conductivity type (e.g., p-type or n-type) impurities. The semiconductor layer may emit light of a specific wavelength band by receiving an electrical signal applied from an external power source.

The light emitting element 30 according to an embodiment may include a first semiconductor layer 31, an active layer 33, a second semiconductor layer 32, and an electrode layer 37 sequentially stacked with each other in a longitudinal direction. The light emitting element may further include an insulating layer 38 covering the outer surfaces of the first semiconductor layer 31, the second semiconductor layer 32, and the active layer 33.

The first semiconductor layer 31 may be, for example, an n-type semiconductor having a first semiconductor type. The first semiconductor layer 31 may be doped with a first conductive dopant. For example, the first conductive dopant may be Si, Ge, Sn, or the like. In an embodiment, the first semiconductor layer 31 may be n-GaN doped with n-type Si.

The second semiconductor layer 32 may be disposed to be spaced apart from the first semiconductor layer 31. The second semiconductor layer 32 may be, for example, a p-type semiconductor having a second conductivity type. The second semiconductor layer 32 may be doped with a second conductive dopant. For example, the second conductive dopant may be Mg, Zn, Ca, Se, Ba, or the like. In an embodiment, the second semiconductor layer 32 may be p-GaN doped with p-type Mg.

The active layer 33 may be disposed between the first semiconductor layer 31 and the second semiconductor layer 32. The active layer 33 may include a material having a single or multiple quantum well structure. The active layer 33 may emit light by coupling of electron-hole pairs according to an electrical signal applied through the first semiconductor layer 31 and the second semiconductor layer 32. However, the disclosure is not limited thereto, and the active layer 33 may have semiconductor materials having a large band gap energy alternately stacked with semiconductor materials having a small band gap energy, and may include other group III to V semiconductor materials according to the wavelength band of the emitted light.

The light emitted from the active layer 33 may be projected through the side surfaces as well as the outer surface of the light emitting element 30 in the longitudinal direction. The directionality of the light emitted from the active layer 33 is not limited to one direction.

The electrode layer 37 may be disposed on the second semiconductor layer 32. The electrode layer 37 may be an ohmic contact electrode. However, the disclosure is not limited thereto, and the electrode layer 37 may be a Schottky contact electrode.

In the display device 10, when the light emitting element 30 is electrically connected to an electrode or a contact electrode, the electrode layer 37 may reduce the resistance between the light emitting element 30 and the electrode or contact electrode. The electrode layer 37 may include conductive metal. For example, the electrode layer 37 may include at least one of aluminum (Al), titanium (Ti), indium (In), gold (Au), silver (Ag), indium tin oxide (ITO), indium zinc oxide (IZO), and indium tin zinc oxide (ITZO). Further, the electrode layer 37 may include an n-type or p-type doped semiconductor material.

The insulating layer 38 is arranged to surround the outer surfaces of the semiconductor layers and electrode layers described above. In an embodiment, the insulating layer 38 may surround at least the outer surface of the active layer 33 and extend along the extension direction of the light emitting element 30. The insulating layer 38 may protect the members. For example, the insulating layer 38 may surround side surfaces of the members to expose both ends of the light emitting element 30 in the longitudinal direction. The insulating layer 38 may include materials having insulating properties. Accordingly, it is possible to prevent an electrical short circuit that may occur when the active layer 33 is in direct contact with the electrode through which the electrical signal is transmitted to the light emitting element 30. Since the insulating layer 38 includes the active layer 33 to protect the outer surface of the light emitting element 30, it is possible to prevent degradation in light emission efficiency.

Further, in some embodiments, the insulating layer 38 may have an outer surface which is surface-treated. When the display device 10 is manufactured, the light emitting elements 30 may be dispersed in an ink and sprayed on the electrodes and then aligned on the electrodes. Here, the surface of the insulating layer 38 may be treated in a hydrophobic or hydrophilic manner in order to prevent the light emitting elements 30 from aggregating with other light emitting elements 30 in the ink.

Figure 5:
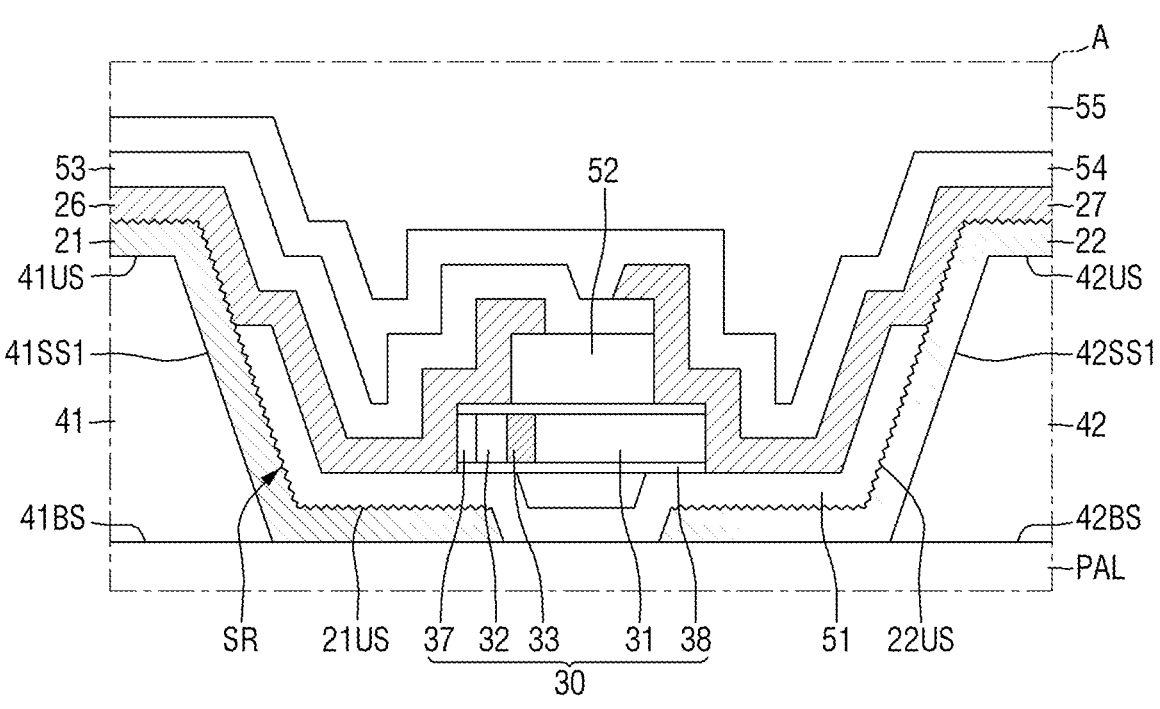
FIG. 5 is an enlarged schematic cross-sectional view illustrating an example of area A of FIG. 3.
Figure 6A:
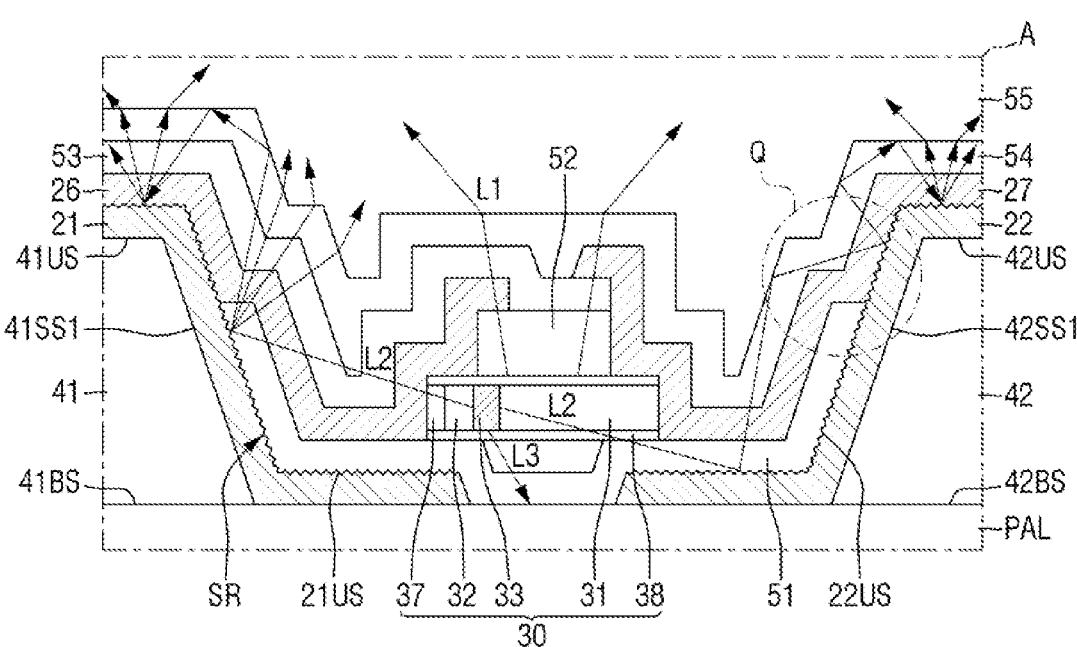
FIG. 6A is an enlarged schematic cross-sectional view illustrating paths of light emitted from a light emitting element.
Figure 6B:
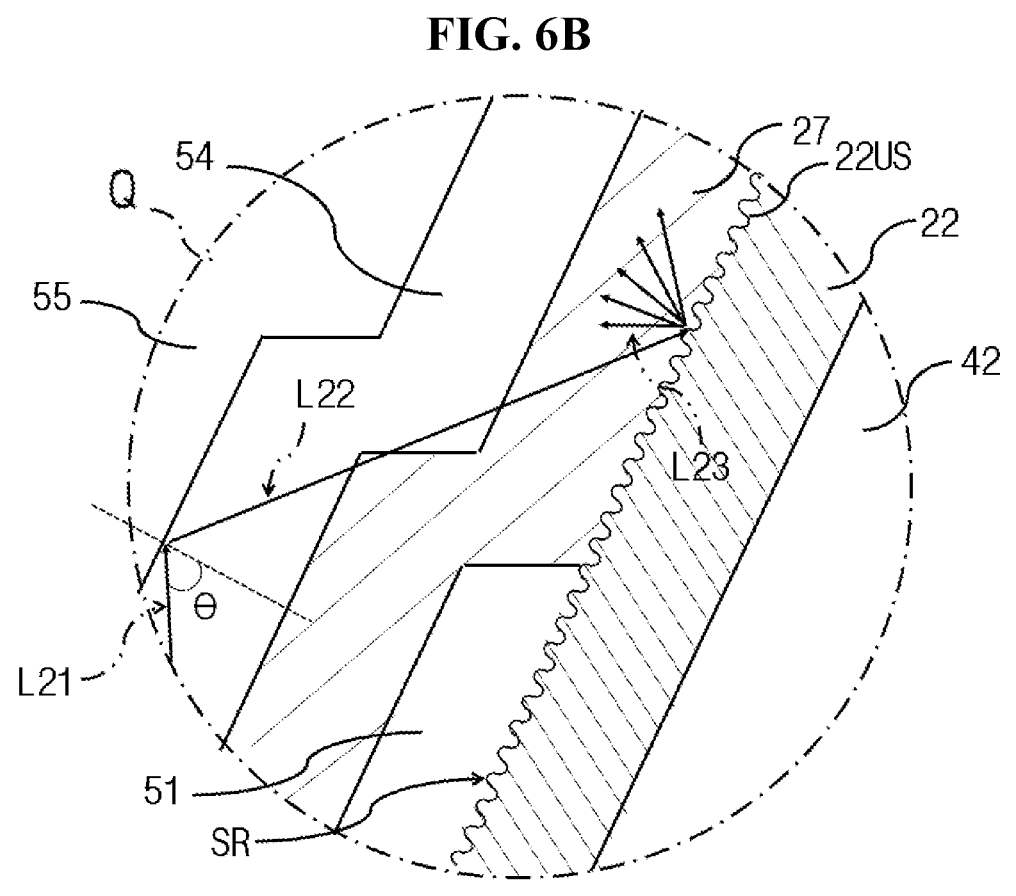

FIG. 5 is an enlarged schematic cross-sectional view illustrating an example of area A of FIG. 3. FIG. 6A is an enlarged schematic cross-sectional view illustrating a traveling path of light emitted from a light emitting element. FIG. 6B is an enlarged schematic cross-sectional view of area Q of FIG. 6A.

Referring to FIGS. 3 to 5, the top surface 21US of the first electrode 21 and the top surface 22US of the second electrode 22 may include surface irregularities SR, respectively.

The first electrode 21 may include surface irregularities SR (first surface irregularities) in the top surface 21US in the region overlapping at least the first side surface 41SS1 of the first sub-bank 41 in the third direction DR3. Similarly, the second electrode 22 may include surface irregularities SR (second surface irregularities) in the top surface 22US in the region overlapping at least the first side surface 42SS1 of the second sub-bank 42 in the third direction DR3. In an embodiment, the first electrode 21 may include the surface irregularities SR (first surface irregularities) on the entire top surface 21US in the region overlapping the first side surface 41SS1, the second side surface 41SS2 and the top surface 41US of the first sub-bank 41 in the third direction DR3. The second electrode 22 may include the surface irregularities SR (or second surface irregularities) on the entire top surface 22US in the region overlapping the first side surface 42SS1, the second side surface 42SS2 and the top surface 42US of the second sub-bank 42 in the third direction DR3.

The surface irregularities SR included in the top surface 21US of the first electrode 21 and the top surface 22US of the second electrode 22 may be formed randomly. In an embodiment, the cross-sectional shape of the surface irregularities SR may be an amorphous random shape. However, the disclosure is not limited thereto, and in some embodiments, the cross-sectional shape of the surface irregularities SR may be a polygon such as a triangle or a trapezoid, or may have a shape of a part of a circle or an ellipse.

The surface irregularities SR formed on the top surface 21US of the first electrode 21 and the top surface 22US of the second electrode 22 may be formed by various methods such as a dry etching method and a plasma etching method after the patterning process forming the first electrode 21 and the second electrode 22. The surface irregularities SR may be formed so that the surfaces of the first electrode 21 and the second electrode 22, the top surfaces 21US and 22US, may have a surface roughness. In an embodiment, the surface irregularities SR formed on the top surface 21US of the first electrode 21 and the top surface 22US of the second electrode 22 may be formed over the entire surface by dry etching after the patterning process for forming the first electrode 21 and the second electrode 22.

The first surface irregularities SR formed on the top surface 21US of the first electrode 21 and the second surface irregularities SR formed on the top surface 22US of the second electrode 22 may be formed simultaneously by the same process. Accordingly, the first surface irregularities SR formed on the top surface 21US of the first electrode 21 and the second surface irregularities SR formed on the top surface 22US of the second electrode 22 may have the same surface roughness.

In an embodiment, the first surface irregularities SR formed on the top surface 21US of the first electrode 21 disposed on the first sub-bank 41 may have the same surface roughness for each area on the first sub-bank 41. For example, the first electrode 21 may have the same surface roughness on the top surface 41US and the first and second side surfaces 41SS1 and 41SS2 of the first sub-bank 41. Although the top surface 21US of the first electrode 21 disposed on the first sub-bank 41 is shown as having the same surface roughness for each area, the disclosure in not limited thereto. In other embodiments, the first electrode 21 may have a different surface roughness for each area on the first sub-bank 41. For example, the surface roughness of the top surface 21US of the first electrode 21 in the region overlapping the top surface 41US of the first sub-bank 41 may be different from the surface roughness of the top surface 21US of the first electrode 21 in the region overlapping the side surface 41SS of the first sub-bank 41. The first electrode 21 disposed on the first sub-bank 41 by the inclined side surface 41SS of the first sub-bank 41 to form the surface irregularities SR may be formed to have different surface roughness for each area.

The surface irregularities SR formed in the first and second electrodes 21 and 22 may irregularly reflect (or diffusely reflect) the light emitted from the light emitting element 30 and proceeding to the top surfaces 21US and 22US of the first and second electrodes 21 and 22. As described above, the first and second electrodes 21 and 22 may include a material having high reflectivity, and each of the top surfaces 21US and 22US of the first and second electrodes 21 and 22 may be a reflective surface reflecting the light emitted from the light emitting element 30 and incident thereon. Each reflective surface (or the top surfaces 21US and 22US) of the first and second electrodes 21 and 22 includes random surface irregularities SR, the light emitted from the light emitting element 30 and incident on the first and second electrodes 21 and 22 may be diffusely reflected in multiple directions from the reflective surfaces 21US and 22US. The light incident on the reflective surfaces 21US and 22US of the first and second electrodes 21 and 22 may be diffusely reflected in various directions by the surface irregularities SR formed on the reflective surfaces 21US and 22US of the first and second electrodes 21 and 22 to proceed to layers disposed on the first and second electrodes 21 and 22 with various incident angles.

As described above, the traveling direction of the light emitted from the light emitting element 30 is not limited to one direction. The light emitted from the light emitting element 30 may be emitted from both ends of the light emitting element 30 to proceed to the first side surface 41SS1 of the first sub-bank 41 and the first side surface 41SS2 of the second sub-bank 42, and may be emitted from the side surface of the light emitting element 30 to proceed to the top or bottom portion of the display device 10.

A part of the light emitted from the light emitting element 30 to proceed to the first side surfaces 41SS1 and 42SS1 of the first and second sub-banks 41 and 42 may pass through the layers disposed on the first and second electrodes 21 and 22 to be emitted to the outside, and another part of the light may not pass through the layers disposed on the first and second electrodes 21 and 22 and may not be emitted to the outside. For example, part of the light emitted from the light emitting element 30 may be emitted to the outside of the light emitting element layer EML, but the other part thereof may not be emitted to the outside of the light emitting element layer EML and may disappear within the light emitting element layer EML. For example, an optical waveguide may be formed by the layers disposed on the first and second electrodes 21 and 22 in the adjacent area of the light emitting element 30, and a part of the light emitted from the light emitting element 30 to proceed to the side surface of the first bank 40 may not be emitted to the outside of the light emitting element layer EML due to the optical waveguide. The optical waveguide may be formed when total reflection occurs due to a difference in refractive indices of the layers disposed in the region adjacent to the light emitting element 30. As an example, total reflection may occur when the refractive index of at least one of the layers (i.e., the first contact electrode 26, the second contact electrode 27, the third insulating layer 53 or the fourth insulating layer 54) disposed on the first and second electrodes 21 and 22 may be greater than the refractive index of the filler 55. A part of the light emitted from the light emitting element 30 may be kept within the layers due to the optical waveguide formed by the layers disposed on the first and second electrodes 21 and 22. Such light may be converted to heat energy, or may be absorbed by other layers and disappear. Accordingly, since the light emitted from the light emitting element 30 is not emitted to the outside of the light emitting element layer EML, the light emission efficiency of the display device 10 may be reduced. The main reason for the formation of the optical waveguide which may reduce the light emission efficiency of the display device 10 may be total reflection occurring due to the difference in refractive indices of the layers disposed on the first and second electrodes 21 and 22. Accordingly, the light emission efficiency of the display device 10 may be increased by reducing the rate of occurrence of the total reflection. In an embodiment, the refractive indices of the third insulating layer 53 and the fourth insulating layer 54 may be different from the refractive indices of the first contact electrode 26 and the second contact electrode 27. In an embodiment, the refractive indices of the third insulating layer 53 and the fourth insulating layers 54 may be smaller than the refractive indices of the first contact electrode 26 and the second contact electrode 27. In an embodiment, the refractive index of the filler 55 may be smaller than the refractive indices of the first contact electrode 26 and the second contact electrode 27. The display device 10 according to an embodiment may form the surface irregularities SR on the top surfaces 21US and 22US of the first and second electrodes 21 and 22 to diffusely reflect the light in a random direction, thereby inducing various incident angles of the light incident on the layers. Accordingly, by inducing various incident angles of the light incident on the layers, a ratio of light incident at an angle equal to or greater than a critical angle at which total reflection may occur to light incident on the layers may be reduced, thereby reducing the formation rate of the optical waveguide.

Hereinafter, the path in which the light emitted from the light emitting element 30 proceeds to the insulating layers and/or the contact electrodes 26 and 27 will be described in more detail with reference to FIGS. 6A and 6B.

As described above, the light generated from the active layer 33 of the light emitting element 30 may be emitted randomly without directionality. Referring to FIG. 6A, the light emitted from the light emitting element 30 may include a first light L1, a second light L2 and a third light L3 according to a schematic light traveling direction. The first light L1 may be light traveling upward, i.e., in the third direction DR3, from the light emitting element 30. The second light L2 may be light traveling laterally, i.e., toward the first surfaces 41SS1 and 42SS1 of the first and second sub-banks 41 and 42, from the light emitting element 30. The third light L3 may be light traveling downward, i.e., in the opposite direction of the third direction DR3, from the light emitting element 30.

The first light L1 may travel upward from the light emitting element 30 and pass through the second insulating layer 52, the first and second contact electrodes 26 and 27, the third insulating layer 53, and the fourth insulating layer 54 disposed on the light emitting element 30 to be emitted to the filler 55. As shown in the drawing, most of the first light L1 traveling upward from the light emitting element 30 may be emitted to, for example, the filler 55 without being totally reflected because its incident angle at the interface between the filler 55 and the fourth insulating layer 54 is smaller than the critical angle at which total reflection occurs. Accordingly, the light emission ratio of the first light L1 may be large.

The second light L2 may travel laterally from the light emitting element 30 to proceed toward the first surfaces 41SS1 and 42SS1 of the first and second sub-banks 41 and 42 facing both ends of the light emitting element 30.

A part of the second light L2 may proceed toward the first side surface 41SS1 of the first sub-bank 41. The second light L2 proceeding toward the first side surface 41SS1 of the first sub-bank 41 may pass through the first and third insulating layers 51 and 53 and the first contact electrode 26 to proceed toward the reflective surface 21US of the first electrode 21 disposed on the first side surface 41SS1 of the first sub-bank 41. The second light L2 may be diffusely reflected from the reflective surface 21US of the first electrode 21 by the surface irregularities SR formed on the reflective surface 21US of the first electrode 21. Accordingly, by randomly changing the direction of the reflected light, the ratio at which the total reflection occurs in the layers disposed on the first electrode 21 may be reduced. As a result, by reducing the occurrence ratio of the total reflection, the ratio at which the second light L2 is not emitted to the outside due to the optical waveguide may be reduced.

Similarly, the other part of the second light L2 may proceed toward the first side surface 42SS1 of the second sub-bank 42. The second light L2 proceeding toward the side of the first side surface 42SS1 of the second sub-bank 42 may pass through the first insulating layer 51 and the second contact electrode 27 to proceed toward the reflective surface 22US of the second electrode 22 disposed on the first side surface 42SS1 of the second sub-bank 42. The second light L2 may be diffusely reflected from the reflective surface 22US of the second electrode 22 by the surface irregularities SR formed on the reflective surface 22US of the second electrode 22. Accordingly, by randomly changing the direction of the reflected light, the ratio at which the total reflection occurs in the layers disposed on the second electrode 22 may be reduced. As a result, by reducing the occurrence ratio of the total reflection, the ratio at which the second light L2 is not emitted to the outside by the optical waveguide may be reduced.

The third light L3 may proceed toward the first insulating layer 51 and the circuit element layer PAL disposed below the light emitting element 30. Most of the third light L3 proceeding toward the first insulating layer 51 and the circuit element layer PAL may be absorbed by the members and disappear. However, the disclosure is not limited thereto, and a part of the third light L3 may be reflected to proceed in the display direction DR3.

Referring to FIG. 6B, a light L21 which is a part of the second light L2 emitted from the light emitting element 30 and proceeding laterally may proceed toward the fourth insulating layer 54. The light L21 proceeding toward the fourth insulating layer 54 may be incident on the interface between the fourth insulating layer 54 and the filler 55. The refractive index of the fourth insulating layer 54 and the refractive index of the filler 55 may be different from each other. When the refractive index of the medium is changed at the interface (for example, the top surface of the fourth insulating layer 54) reached by the incident light, an optical interface may be formed. When the optical interface is formed, the light L21 incident toward the interface between the fourth insulating layer 54 and the filler 55 may be refracted or reflected. The proceeding direction of the light L21 incident toward the interface of the fourth insulating layer 54 and the filler 55 may be determined according to an incident angle θ. For example, when the incident angle θ is smaller than the critical angle (the incident angle at which total reflection starts to occur), at least a part of the light L21 may be refracted at the interface to pass through the interface and then proceed toward the filler 55. When the incident angle θ is the same as the critical angle, the light L21 may proceed along the interface, that is the top surface of the fourth insulating layer 54. When the incident angle θ is greater than the critical angle, the light L21 may be totally reflected at the interface to proceed toward the fourth insulating layer 54. FIG. 6B illustrates, by way of example, a case where the incident angle θ of the light L21 proceeding to the fourth insulating layer 54 is larger than the critical angle.

When the light L21 proceeding to the fourth insulating layer 54 is incident at the incident angle θ greater than the critical angle, the light L21 may be totally reflected at the interface between the fourth insulating layer 54 and the filler 55. A light L22 totally reflected at the interface between the fourth insulating layer 54 and the filler 55 may be incident on the top surface 22US of the second electrode 22. The light L22 totally reflected and incident on the top surface 22US of the second electrode 22 may be diffusely reflected in various directions by the surface irregularities SR formed on the top surface 22US of the second electrode 22 as described above. Accordingly, a light L23 diffusely reflected from the top surface 22US of the second electrode 22 by the surface irregularities SR may have various reflection angles and proceed toward the fourth insulating layer 54. Therefore, as the light L23 diffusely reflected from the top surface 22US of the second electrode 22 is diffusely reflected with various reflection angles, a ratio of light incident at an incident angle greater than the critical angle to the light proceeding toward the fourth insulating layer 54 may be reduced. Accordingly, no more total reflection may occur at the interface between the fourth insulating layer 54 and the filler 55. As a result, the ratio at which the light is not emitted to the outside by the optical waveguide may be reduced.

According to the embodiment described above, by forming random surface irregularities SR on the top surfaces 21US and 22US (or reflective surfaces) of the first electrode 21 and the second electrode 22, the light incident on the top surfaces 21US and 22US of the first and second electrodes 21 and 22 may be diffusely reflected and the light traveling direction may be randomly changed. Therefore, by randomly changing the light traveling direction, the occurrence ratio of the total reflection which may occur due to the difference in refractive indices between the plurality of layers may be reduced, thereby reducing the formation rate of the optical waveguide. Accordingly, the light loss caused by the optical waveguide may be reduced to increase the light emission efficiency of the display device 10.

As the surface irregularities SR are formed on the top surfaces 21US and 22US of the first and second electrodes 21 and 22, the surface area of the first and second electrodes 21 and 22 may increase. Accordingly, the surface area of the first and second electrodes 21 and 22 may increase to reduce the resistance of the first and second electrodes 21 and 22 which transmit an electrical signal from the circuit element layer PAL, thereby increasing the reliability of the display device.

The heat generated within the display device 10, for example, the heat generated when the light emitting element 30 emits light, may have a heat dissipation path in which heat is diffused to the first and second electrodes 21 and 22 via the contact electrodes 26 and 27 through the portion in which the contact electrodes 26 and 27 and the light emitting element 30 are in physical contact. For example, the heat energy emitted from the light emitting element 30 may be dissipated through the first and second electrodes 21 and 22. As the surface irregularities SR are formed on the top surfaces 21US and 22US of the first and second electrodes 21 and 22, the surface areas of the first and second electrodes 21 and 22 increase to increase the heat dissipation area, thereby increasing the heat dissipation efficiency.

Hereinafter, other embodiments will be described. In the following descriptions, components that have been previously described will be omitted or simplified to avoid repetition, and differences will be described.

Figure 7:
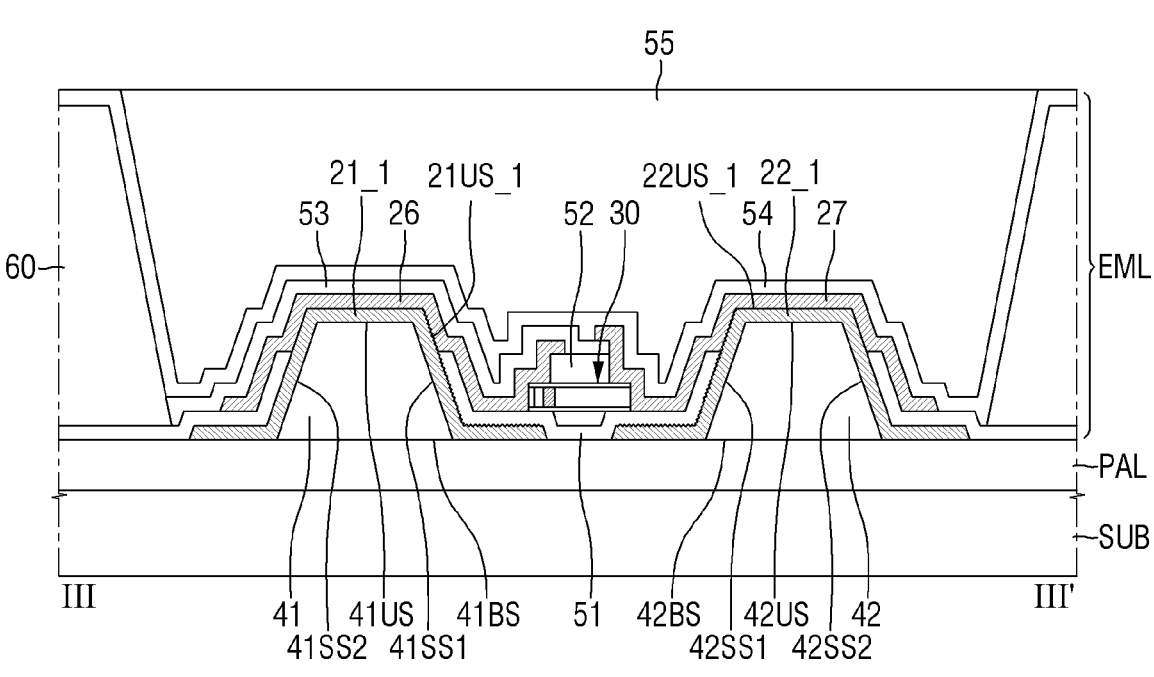
FIG. 7 is a schematic cross-sectional view illustrating an example taken along line III-III' of FIG. 2.
Figure 8:
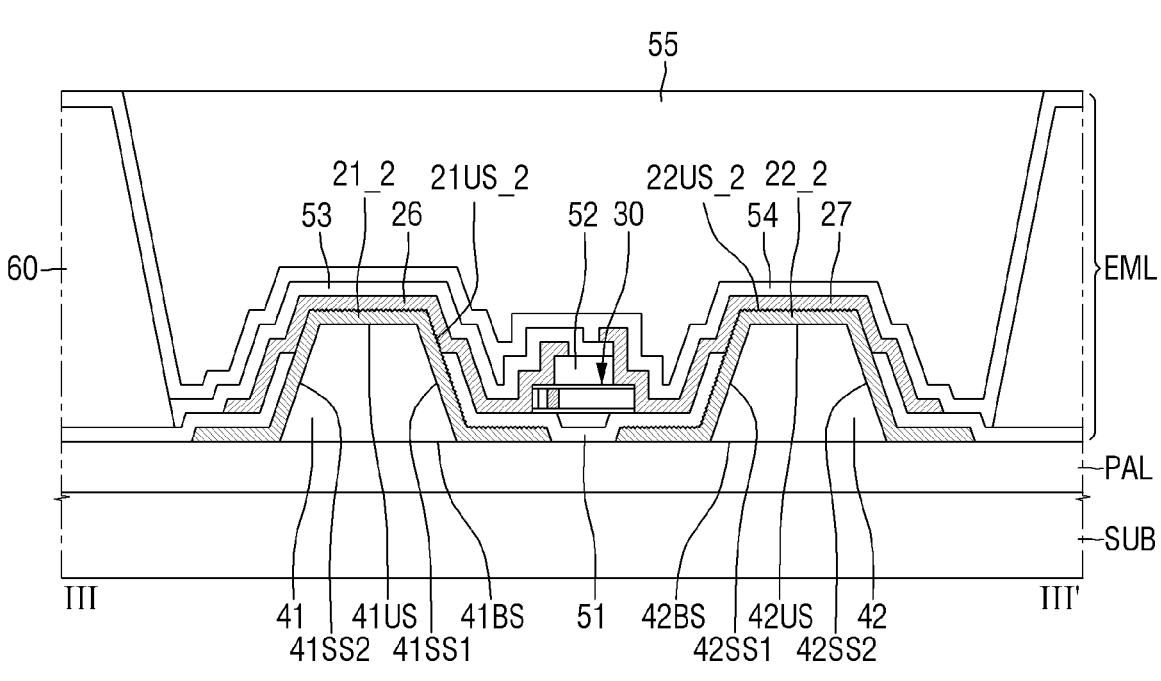
FIG. 8 is a schematic cross-sectional view illustrating an example taken along line III-III' of FIG. 2.

FIG. 7 is a schematic cross-sectional view illustrating another example taken along line III-III' of FIG. 2. FIG. 8 is a schematic cross-sectional view illustrating still another example taken along line III-III' of FIG. 2.

Embodiments of FIGS. 7 and 8 are different from the embodiment of FIG. 3 in that the surface irregularities formed on the top surfaces of the first and second electrodes are formed only in a partial region of the first and second electrodes.

Referring to FIG. 7, a first electrode 21_1 may have surface irregularities only in the region overlapping the first side surface 41SS1 of the first sub-bank 41 in the third direction DR3. Similarly, a second electrode 22_1 may have surface irregularities only in the region overlapping the first side surface 42SS1 of the second sub-bank 42 in the third direction DR3. In the embodiment, even though the surface irregularities SR are formed only on a partial region of the first electrode 21_1 and the second electrode 22_1, on the first side surfaces 41SS1 and 41SS2 of the first and second sub-banks 41 and 42, most of the light emitted from the light emitting element 30 to proceed laterally may be diffusely reflected by the surface irregularities SR of the first and second electrodes 21_1 and 22_1 disposed on the first and second side surfaces 41SS1 and 42SS1 of the first and second sub-banks 41 and 42. Accordingly, even though the surface irregularities SR are formed only in a partial region, most of the light is diffusely reflected to reduce the formation rate of the optical waveguide, thereby improving the light emission efficiency of the display device 10.

Referring to FIG. 8, it is different from the embodiment of FIG. 3 in that surface irregularities formed on top surfaces 21US_2 and 22US_2 of first and second electrodes 21_2 and 22_2 are formed only in a partial region. The first electrode 21_2 may have surface irregularities only in the region overlapping the first side surface 41SS1 and the top surface 41US of the first sub-bank 41 in the third direction DR3. Similarly, the second electrode 22_2 may have surface irregularities only in the region overlapping the first side surface 42SS1 and the top surface 42US of the second sub-bank 42 in the third direction DR3. For example, the first and second electrodes 21_2 and 22_2 may not include the surface irregularities SR in the region overlapping the second side surfaces 41SS2 and 42SS2 of the first and second sub-banks 41 and 42 in the third direction DR3, respectively.

In the embodiment, since the ratio of the light emitted from the light emitting element 30 to proceed to the second side surfaces 41SS2 and 42SS2 of the first and second sub-banks 41 and 42 is relatively small, the light emission efficiency of the display device 10 may be improved even though the surface irregularities SR are not formed in a partial region of the first electrode 21_2 and the second electrode 22_2 overlapping the second side surfaces 41SS2 and 42SS2 of the first and second sub-banks 41 and 42 in the third direction DR3.

Figure 9:
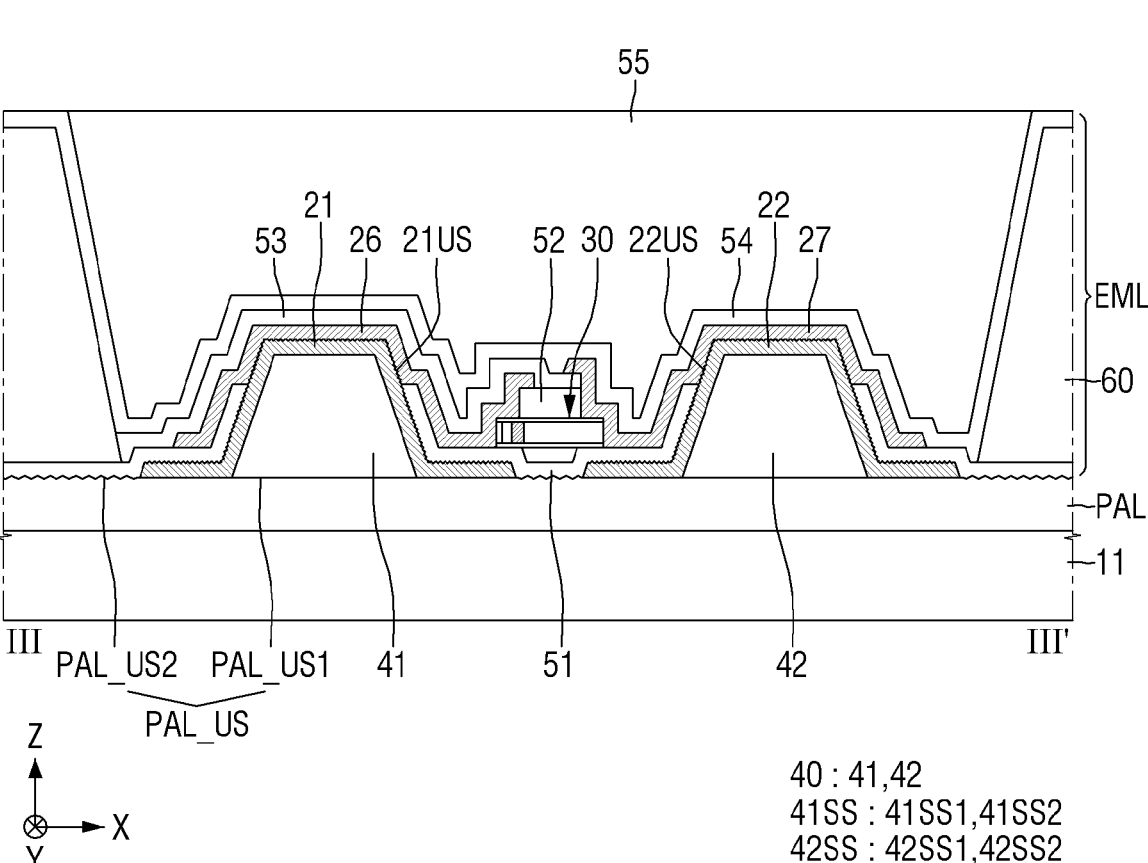
FIG. 9 is a schematic cross-sectional view illustrating an example taken along line III-III' of FIG. 2.

FIG. 9 is a schematic cross-sectional view illustrating another example taken along line III-III' of FIG. 2.

Referring to FIG. 9, it is different from the embodiment of FIG. 3 in that surface irregularities are also formed in a partial region of a surface of the circuit element layer PAL.

A surface PAL_US of the circuit element layer PAL on which the first and second sub-banks 41 and 42 are disposed may include a first region PAL_US1 overlapping the first and second electrodes 21 and 22 in the third direction DR3 and a second region PAL_US2 not overlapping the first and second electrodes 21 and 22 in the third direction DR3. Surface irregularities may be formed on the surface PAL_US of the circuit element layer PAL not overlapping the first and second electrodes 21 and 22, the second region PAL_US2. The surface roughness of the second region PAL_US2 of the circuit element layer PAL may be different from the surface roughness of the first and second electrodes 21 and 22. For example, the surface roughness of the second region PAL_US2 of the circuit element layer PAL may be smaller than the surface roughness of the first and second electrodes 21 and 22.

After a patterning process for forming the first and second electrodes 21 and 22, the surface irregularities formed on the surface PAL_US of the circuit element layer PAL may be formed in an etching process for forming the surface irregularities SR on the top surfaces 21US and 22US of the first and second electrodes 21 and 22. For example, when a front etching process is performed in the etching process for forming irregularities on the surfaces of the first and second electrodes 21 and 22, the surface PAL_US of the circuit element layer PAL exposed by the first and second electrodes 21 and 22, the second region PAL_US2 may also be etched to have a surface with the surface roughness.

Figure 10:
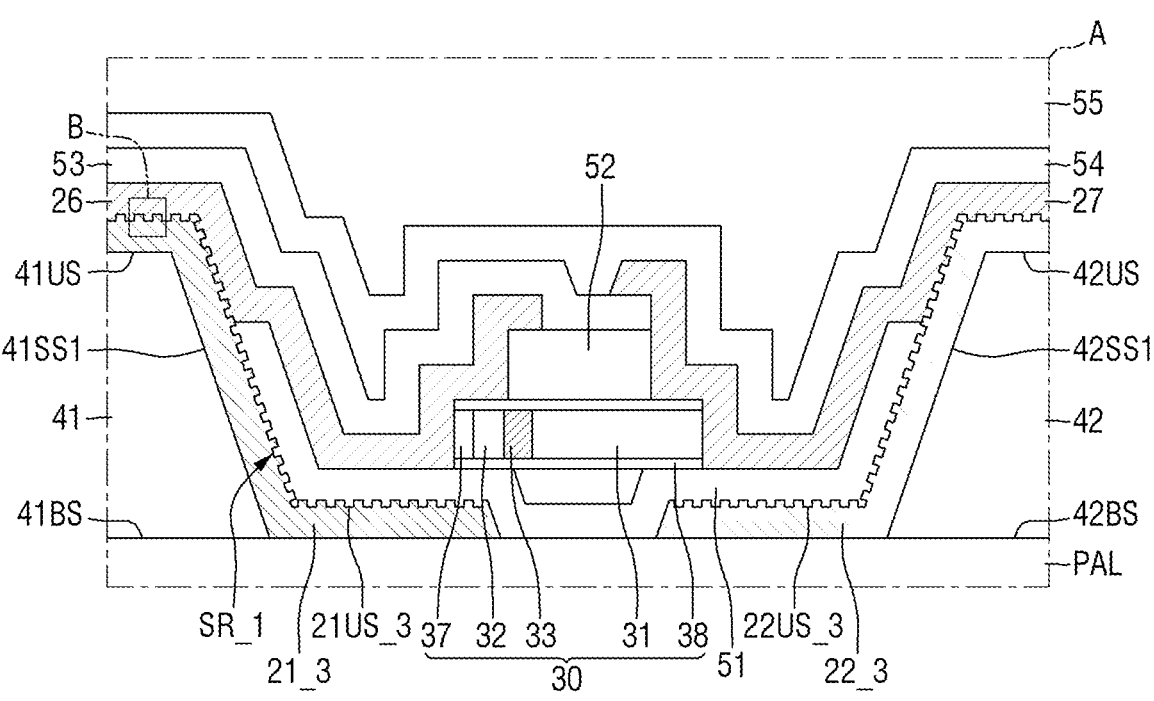
FIG. 10 is an enlarged schematic cross-sectional view illustrating another example of area A of FIG. 3.
Figure 11:
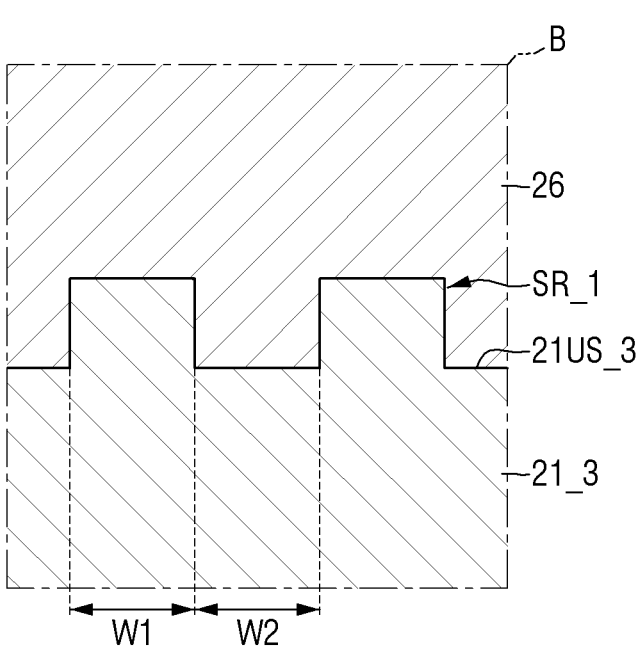
FIG. 11 is an enlarged schematic cross-sectional view of area B of FIG. 10.

FIG. 10 is an enlarged schematic cross-sectional view illustrating another example of area A of FIG. 3. FIG. 11 is an enlarged schematic cross-sectional view of area B of FIG. 10.

Referring to FIGS. 10 and 11, the display device according to the embodiment is different from the embodiment of FIG. 5 in that surface irregularities SR_1 formed on the top surface thereof have a constant pattern.

The patterned surface irregularities SR_1 may be formed on top surfaces 21US_3 and 22US_3 of first and second electrodes 21_3 and 22_3. The surface irregularities SR_1 may be formed repetitively on the top surfaces 21US_3 and 22US_3 of the first and second electrodes 21_3 and 22_3 with a constant period and size. After performing a patterning process of the first and second electrodes 21_3 and 22_3, the surface irregularities SR_1 formed on the top surfaces 21US_3 and 22US_3 of the first and second electrodes 21_3 and 22_3 may be formed using nanosphere lithography, E-beam lithography, block copolymer lithography, or the like.

The cross-sectional shape of the patterned surface irregularities SR_1 may be a polygonal shape such as a triangle, a quadrilateral or a trapezoid having a constant size, or may be a part of a circular or elliptical shape. Although it is illustrated in the drawing that the cross-sectional shape of the surface irregularities SR_1 is a quadrilateral, it is not limited thereto. The surface irregularities SR_1 may have a constant width W1 and may be formed at a constant interval W2. The width W1 of the surface irregularities SR_1 and the interval W2 between the surface irregularities SR_1 may be the same although the embodiments are not limited thereto. The width W1 of the surface irregularities SR_1 may be within a range similar to the wavelength band of light emitted from the light emitting element 30. When the light emitted from the light emitting element 30 has a first wavelength band, the width W1 and the interval W2 of the surface irregularities SR_1 may be adjusted within the range of the first wavelength band. For example, when the light emitted from the light emitting element 30 is a blue light having a central wavelength band of about 450 nm to about 495 nm, the width W1 and the interval W2 of the surface irregularities SR_1 may have a range of about 450 nm to about 495 nm.

In the embodiment, the surface irregularities SR_1 formed on the top surface 21US_3 of the first electrode 21_3 (the first surface irregularities) and the surface irregularities SR_1 formed on the top surface 22US_3 of the second electrode 22_3 (the second surface irregularities) may be the same. However, the disclosure is not limited thereto, and the first surface irregularities and the second surface irregularities may be formed differently.

Figure 12:
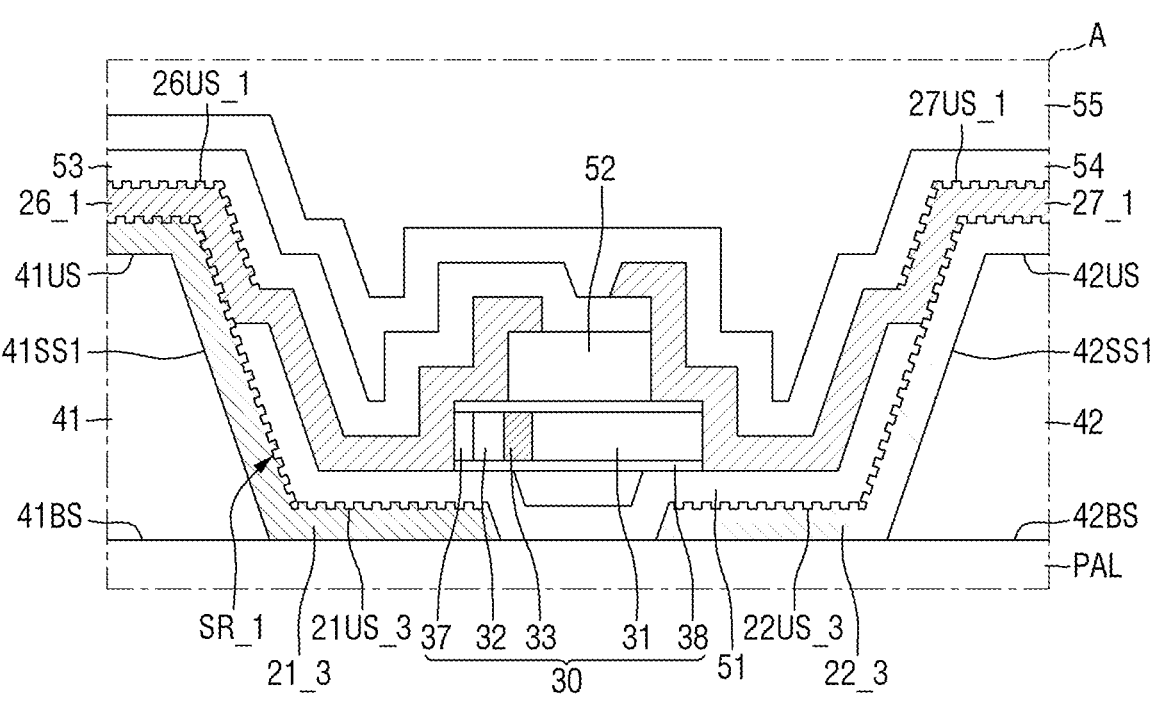
FIG. 12 is an enlarged schematic cross-sectional view illustrating an example of area A of FIG. 3.

FIG. 12 is an enlarged schematic cross-sectional view illustrating another example of area A of FIG. 3.

Referring to FIG. 12, a display device according to the embodiment is different from the embodiment of FIG. 11 in that it includes first and second contact electrodes 26_1 and 27_1 in which the patterned surface irregularities are formed.

The first contact electrode 26_1 and the second contact electrode 27_1 may be conformally disposed on the first electrode 21_3, a second electrode 22_3 and the first insulating layer 51, respectively. The surface shape of the first contact electrode 26_1 and the second contact electrode 27_1 may have a shape similar to the surface shape of the layer disposed below. For example, when the surface of the layer disposed below the first contact electrode 26_1 and the second contact electrode 27_1 has a textured surface, the surfaces of the first contact electrode 26_1 and the second contact electrode 27_1 may also have a textured surface, and when the surface of the layer disposed below is flat, the surfaces of the first contact electrode 26_1 and the second contact electrode 27_1 may also be flat. In an embodiment, the first contact electrode 26_1 may include surface irregularities (third surface irregularities) in the region directly disposed on the top surface 21US_3 of the first electrode 21_3 having the surface irregularities SR_1 (or first surface irregularities), and may have a flat surface shape in the region disposed on the first insulating layer 51 having a flat surface. Similarly, the second contact electrode 27_1 may include surface irregularities (fourth surface irregularities) in the region directly disposed on the top surface 22US_3 of the second electrode 22_3 having the surface irregularities SR_1 (or second surface irregularities), and may have a flat surface shape in the region disposed on the first insulating layer 51 having a flat surface. The surface irregularities of first and second contact electrode 26_1 and 27_1 will correspond the surface irregularities SR_1 of the first and second electrodes 21_3 and 22_3 in the regions where the first and second contact electrodes 26_1 and 27_1 contact the first and second electrodes 21_3 and 22_3.

Although the first and second contact electrodes 26_1 and 27_1 disposed on the first and second electrodes 21_3 and 22_3 are shown to have the same surface roughness as the surface roughness of the first and second electrodes 21_3 and 22_3 in the drawings, the disclosure is not limited thereto. As the first and second contact electrodes 26_1 and 27_1 are conformally formed on the first and second electrodes 21_3 and 22_3, the shape of the surface irregularities SR_1 of the first and second electrodes 21_3 and 22_3 disposed thereunder may be reflected but the size of the surface irregularities on the first and second contact electrodes 26_1 and 27_1 may be smaller than the size of the surface irregularities SR_1 formed in the first and second electrodes 21_3 and 22_3. For example, the surface roughness of the third surface irregularities of the first contact electrode 26_1 disposed on the first electrode 21_3 may be smaller than the surface roughness of the first surface irregularities of the first electrode 21_3. Similarly, the surface roughness of the fourth surface irregularities of the second contact electrode 27_1 disposed on the second electrode 22_3 may be smaller than the surface roughness of the second surface irregularities of the second electrode 22_3.

In the embodiment, as the top surfaces of the first and second contact electrodes 26_1 and 27_1 also include a textured surface, the occurrence ratio of the diffuse reflection that may occur at the interface between the first and second contact electrodes 26_1 and 27_1 and the fourth insulating layer 54 may be reduced. Accordingly, an optical waveguide may be prevented from being formed by the layers disposed on the first and second electrodes 21_3 and 22_3, thereby improving the light emission efficiency of the display device 10.

Figure 13:
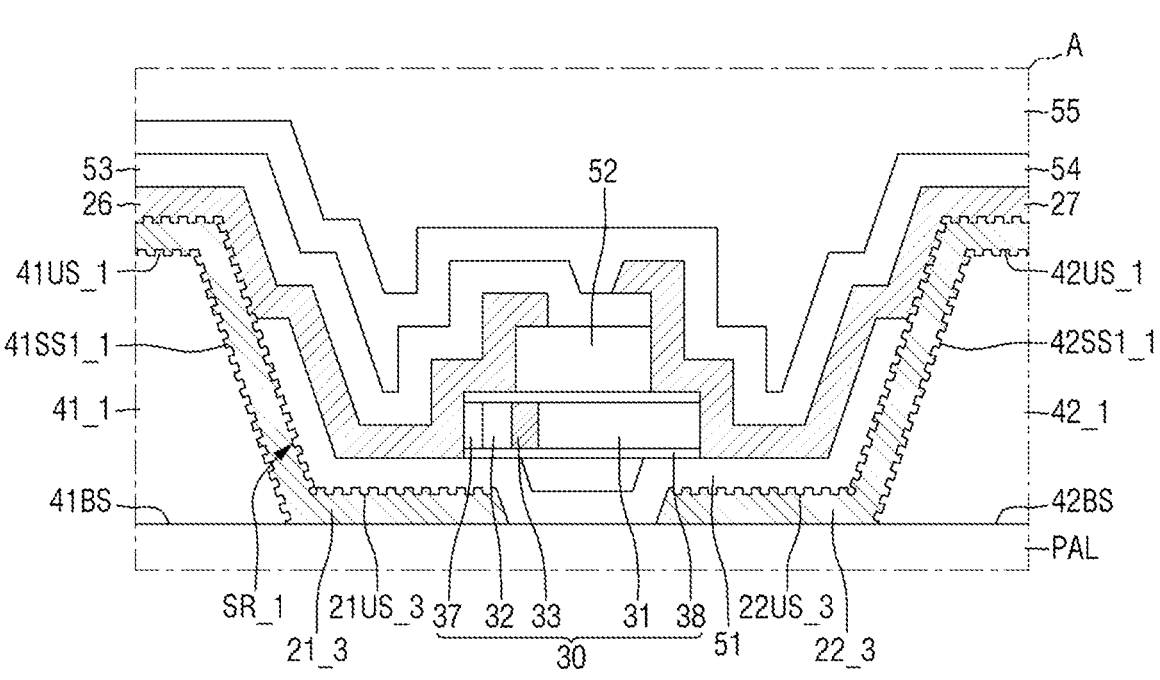
FIG. 13 is an enlarged schematic cross-sectional view illustrating an example of area A of FIG. 3.

FIG. 13 is an enlarged schematic cross-sectional view illustrating still another example of area A of FIG. 3.

Referring to FIG. 13, the display device according to the embodiment is different from the embodiment of FIG. 12 in that it includes first and second sub-banks 41_1 and 42_1 having patterned surface irregularities formed on their surfaces.

The first and second sub-banks 41_1 and 42_1 may have patterned surface irregularities on their surfaces. For example, the top surface 41US_1 and the first side surface 41SS1_1 of the first sub-bank 41_1 may have patterned surface irregularities. The top surface 42US_1 and the first side surface 42SS1_1 of the second sub-bank 42_1 may have patterned surface irregularities.

The first electrode 21_3 may be conformally disposed on the first sub-bank 41_1. Accordingly, the surface shape of the first electrode 21_3 may have a shape similar to the surface shape of the first sub-bank 41_1. For example, when the top surface 41US_1 and the first side surface 41SS1_1 of the first sub-bank 41_1 have patterned surface irregularities, the first electrode 21_3 may be conformally stacked on the first sub-bank 41_1, so that the top surface 21US_3 of the first electrode 21_3 may also have patterned surface irregularities SR_1.

Similarly, the second electrode 22_3 may be disposed conformally on the second sub-bank 42_1. Accordingly, the surface shape of the second electrode 22_3 may have a shape similar to the surface shape of the second sub-bank 42_1. For example, when the top surface 42US_1 and the first side surface 42SS1_1 of the second sub-bank 42_1 have patterned surface irregularities, the second electrode 22_3 may be conformally stacked on the second sub-bank 42_1, so that the top surface 22US_3 of the second electrode 22_3 may also have the surface irregularities SR_1.

Figure 14:
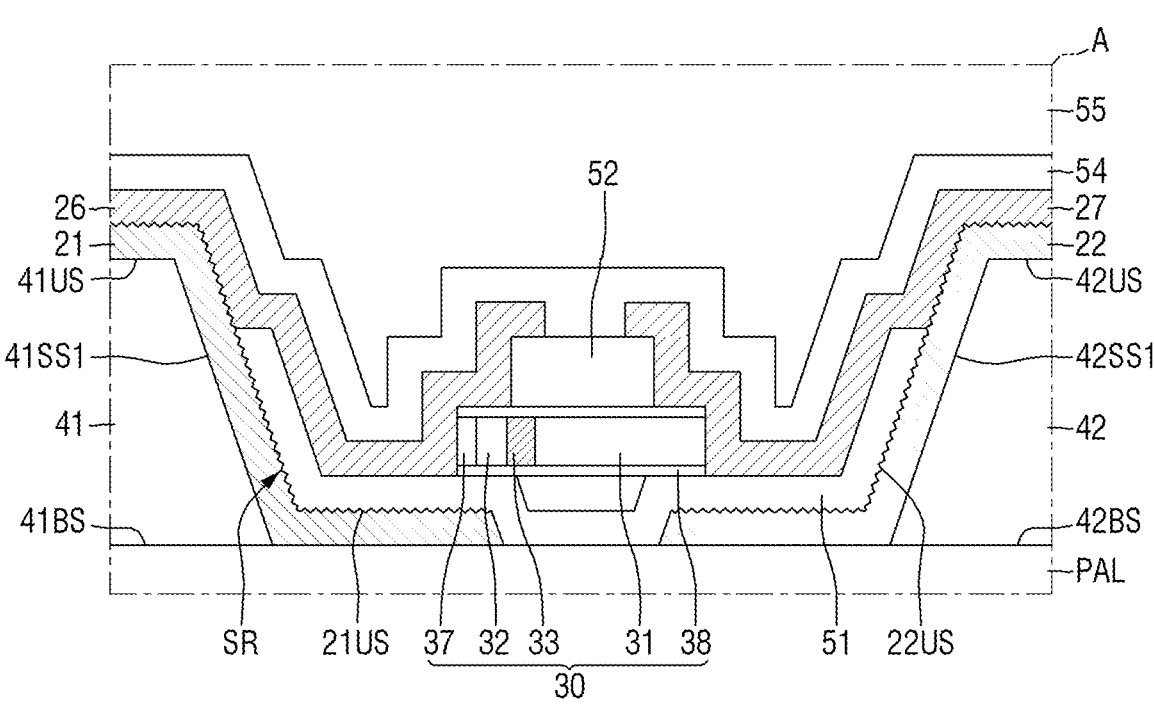
FIG. 14 is an enlarged schematic cross-sectional view illustrating an example of area A of FIG. 3.

FIG. 14 is an enlarged schematic cross-sectional view illustrating still another example of area A of FIG. 3.

Referring to FIG. 14, the display device 10 according to the embodiment is different from the embodiment of FIG. 3 in that the third insulating layer 53 is omitted.

The first contact electrode 26 and the second contact electrode 27 may be directly disposed on the second insulating layer 52. The first contact electrode 26 and the second contact electrode 27 may be spaced apart from each other on the second insulating layer 52 to expose a part of the second insulating layer 52. The second insulating layer 52 exposed by the first contact electrode 26 and the second contact electrode 27 may contact the fourth insulating layer 54 in the exposed region.

In the embodiment, even when the third insulating layer 53 is omitted in the display device 10, the second insulating layer 52 may include an organic insulating material to perform the function of fixing the light emitting element 30. The first contact electrode 26 and the second contact electrode 27 may be patterned and formed simultaneously by a single mask process. Accordingly, since no additional mask process is required to form the first contact electrode 26 and the second contact electrode 27, the process efficiency may be improved. The embodiment is the same as the embodiment of FIG. 3 except that the third insulating layer 53 is omitted, and thus the description of the same components will not be repeated.

Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure as set forth in the following claims.

What is claimed is:

1. A display device comprising:
   a first reflective electrode disposed on a surface of a substrate, and including first surface irregularities disposed on a top surface of the first reflective electrode;
   a second reflective electrode spaced apart from the first reflective electrode, disposed on the surface of the substrate, and including second surface irregularities disposed on a top surface of the second reflective electrode;
   a light emitting element disposed between the first reflective electrode and the second reflective electrode,
   a first contact electrode disposed on the first reflective electrode, a second contact electrode disposed on the second reflective electrode, a second insulating layer disposed on the first contact electrode and the second contact electrode, and covering the first contact electrode and the second contact electrode, and a filler disposed on the first and second contact electrodes, wherein the refractive index of the second insulating layer is smaller than the refractive index of the first contact electrode and smaller than the refractive index of the second contact electrode, wherein a refractive index of the filler is smaller than the refractive index of the first contact electrode and smaller than the refractive index of the second contact electrode, and wherein the refractive index of the filler is smaller than the refractive index of the second insulating layer.

2. The display device of claim 1, wherein each of the first reflective electrode and second reflective electrode comprises silver, aluminum, gold, platinum, palladium, indium, nickel, chrome, or an alloy thereof.

3. The display device of claim 1, wherein the first surface irregularities and the second surface irregularities have a same surface roughness.

4. The display device of claim 1, wherein the first surface irregularities and the second surface irregularities each have a random shape.

5. The display device of claim 1, wherein the first surface irregularities and the second surface irregularities are patterned to have a constant size.

6. The display device of claim 5, wherein a size of each of the first surface irregularities and the second surface irregularities is within a range of a wavelength band of light emitted from the light emitting element.

7. The display device of claim 1, further comprising:

a first sub-bank disposed on the surface of the substrate, and including a side surface facing a first end of the light emitting element, wherein the first reflective electrode is disposed on the first sub-bank, and the first surface irregularities are disposed in a region overlapping at least the side surface of the first sub-bank.

8. The display device of claim 7, further comprising:

a second sub-bank spaced apart from the first sub-bank, disposed on the surface of the substrate, and including a side surface facing a second end of the light emitting element, wherein the second reflective electrode is disposed on the second sub-bank, and including the second surface irregularities disposed in a region overlapping at least the side surface of the second sub-bank.

9. The display device of claim 1, further comprising:

a first insulating layer disposed on the first reflective electrode and the second reflective electrode, wherein the first insulating layer exposes at least a part of the first reflective electrode and at least a part of the second reflective electrode, and the light emitting element is disposed on the first insulating layer.

10. The display device of claim 9, wherein the first contact electrode electrically contacts the first reflective electrode exposed by the first insulating layer and electrically contacts a first end of the light emitting element; and the second contract electrode electrically contacts the second reflective electrode exposed by the first insulating layer and electrically contacts a second end of the light emitting element.

11. The display device of claim 10, wherein the first contact electrode electrically connects the light emitting element and the first reflective electrode that are spaced apart from each other, and the second contact electrode electrically connects the light emitting element and the second reflective electrode that are spaced apart from each other.

12. The display device of claim 10, wherein the first contact electrode includes third surface irregularities that correspond to the first surface irregularities of the first reflective electrode and are disposed in a region where the first contact electrode contacts the first reflective electrode.

13. A display device comprising:

a first electrode disposed on a substrate, and including surface irregularities disposed on a top surface of the first electrode;

a second electrode spaced apart from the first electrode, disposed on the substrate, and including surface irregularities disposed on a top surface of the second electrode;

a light emitting element disposed between the first electrode and the second electrode;

a first contact electrode disposed on the first electrode, the first contact electrode electrically connecting the first electrode to a first end of the light emitting element;

a second contact electrode disposed on the second electrode, the second contact electrode electrically connecting the second electrode to a second end of the light emitting element;

an insulating layer disposed on the first contact electrode and the second contact electrode, and covering the first contact electrode and the second contact electrode, and a filler disposed on the first and second contact electrodes, wherein the refractive index of the insulating layer is smaller than the refractive index of the first contact electrode and smaller than the refractive index of the second contact electrode wherein a refractive index of the filler is smaller than the refractive index of the first contact electrode and smaller than the refractive index of the second contact electrode, and wherein the refractive index of the filler is smaller than the refractive index of the insulating layer.

14. The display device of claim 13, wherein each of the first electrode and the second electrode comprises silver, aluminum, gold, platinum, palladium, indium, nickel, chrome, or an alloy thereof.

15. The display device of claim 13, wherein the surface irregularities of the first electrode and the surface irregularities of the second electrode are patterned to have a constant size.

16. The display device of claim 15, wherein a size of each of the surface irregularities of the first electrode and the surface irregularities of the second electrode is within in a range of a wavelength band of light emitted from the light emitting element.

* * * * *